US012635142B2

(12) United States Patent
Ha et al.

(10) Patent No.: US 12,635,142 B2
(45) Date of Patent: May 19, 2026

(54) THREE-DIMENSIONAL NON-VOLATILE MEMORY DEVICE INCLUDING HORIZONTAL CHANNEL REGION

(71) Applicant: Samsung Electronics Co., Ltd., Suwon-si (KR)

(72) Inventors: Daewon Ha, Suwon-si (KR); Kyunghwan Lee, Suwon-si (KR); Hyunmog Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 684 days.

(21) Appl. No.: 18/055,974

(22) Filed: Nov. 16, 2022

(65) Prior Publication Data

US 2023/0292522 A1     Sep. 14, 2023

(30) Foreign Application Priority Data

Mar. 11, 2022     (KR) ........................ 10-2022-0030949

(51) Int. Cl.
H10B 51/20 (2023.01)
H10B 51/10 (2023.01)
H10B 51/40 (2023.01)

(52) U.S. Cl.
CPC ............. H10B 51/20 (2023.02); H10B 51/10 (2023.02); H10B 51/40 (2023.02)

(58) Field of Classification Search
CPC ......... H10B 51/20; H10B 51/30; H10B 51/40
See application file for complete search history.

(56) References Cited

U.S. PATENT DOCUMENTS 8,203,177 B2     6/2012  Shin et al.
10,211,223 B2    2/2019  Van Houdt et al.
(Continued)

FOREIGN PATENT DOCUMENTS

CN        113410255 A      9/2021
CN        113488504 A      10/2021
(Continued)

OTHER PUBLICATIONS

Pahwa Girish et al: "Physical Insights on Negative Capacitance Transistors in Nonhysteresis and Hysteresis Regimes : MFMIS Versus MFIS Structures",IEEE Transactions on Electron Devices,[Online] vol. 65, Jan. 1, 2018 (Jan. 1, 2018), p. 867, XP093054390, DOI: 10.1109/TED.2018.2794499 Internet Retrie.
(Continued)

*Primary Examiner* — Matthew E Warren
(74) *Attorney, Agent, or Firm* — Fish & Richardson P.C.

(57) ABSTRACT
A three-dimensional non-volatile memory device includes a memory cell array including a plurality of memory cells repeatedly arranged in a first lateral direction, a second lateral direction, and a vertical direction on a substrate. The first lateral direction and the second lateral direction are parallel to a main surface of the substrate and perpendicular to each other, and the vertical direction is perpendicular to the main surface of the substrate. The memory cell array includes a plurality of horizontal channel regions and a vertical word line. The plurality of horizontal channel regions extend in the first lateral direction on the substrate. The plurality of horizontal channel regions overlap each other and are apart from each other in the vertical direction. The vertical word line passes through the plurality of horizontal channel regions in the vertical direction.

20 Claims, 40 Drawing Sheets

(56) References Cited

U.S. PATENT DOCUMENTS

| | | | |
|---|---|---|---|
| 11,088,170 | B2 | 8/2021 | Zhang et al. |
| 11,164,890 | B2 | 11/2021 | Zhang et al. |
| 11,171,157 | B1 | 11/2021 | Lai et al. |
| 2010/0172182 | A1 | 7/2010 | Seol et al. |
| 2020/0203427 | A1 * | 6/2020 | Noh ........................ H10B 63/84 |
| 2021/0020659 | A1 | 1/2021 | Chen |
| 2021/0175252 | A1 | 6/2021 | Han et al. |
| 2021/0183872 | A1 * | 6/2021 | Lai .......................... G11C 17/16 |
| 2021/0242239 | A1 | 8/2021 | Lin et al. |
| 2021/0399052 | A1 * | 12/2021 | Wu ....................... H10D 30/701 |
| 2021/0408043 | A1 | 12/2021 | Yeong et al. |
| 2023/0011675 | A1 * | 1/2023 | Lee ........................ H10B 51/10 |

FOREIGN PATENT DOCUMENTS

| KR | 10-2010-0081559 | A | 7/2010 |
|---|---|---|---|
| KR | 10-0985881 | B1 | 10/2010 |
| KR | 10-2016-0059930 | A | 5/2016 |
| KR | 10-2020-0078048 | A | 7/2020 |
| KR | 10-2021-0043235 | A | 4/2021 |
| KR | 10-2022-0017263 | A | 2/2022 |

OTHER PUBLICATIONS

EESR dated Jul. 11, 2023 for corresponding EP Patent Application No. 23160697.1.

Seonjun Choi, 'A Novel Structure and Operation Scheme of Vertical Channel NAND Flash with Ferroelectric Memory for Multi String Operations', Electronics 2021, 10, 32. pp. 1-12.

Eui Joong Shin, "Capacitance Boosting by Anti-Ferroelectric Blocking Layer in Charge Trap Flash Memory Device", IEEE, Dec. 2020, pp. 1-5.

European Office Action dated Apr. 22, 2025 issued in corresponding European Appln. No. 23160697.1.

J. Lee et al. 'Resistive switching phenomena: A review of statistical physics approaches', Applied Physics Reviews, American Institute of Physics, vol. 2, 031303, 2015, XP012211120, DOI: 10.1063/1.4929512, pp. 031303-1-031303-57.

Office Action in Korean Appln. No. 10-2022-0030949, mailed on Sep. 24, 2025, 31 pages (with English translation).

* cited by examiner

X1–X1'

X6-X6'

X7-X7'

124

LV1

Y

X

Z

LV1

THREE-DIMENSIONAL NON-VOLATILE MEMORY DEVICE INCLUDING HORIZONTAL CHANNEL REGION

CROSS-REFERENCE TO RELATED APPLICATION

This application is based on and claims priority under 35 U.S.C. § 119 to Korean Patent Application No. 10-2022-0030949, filed on Mar. 11, 2022, in the Korean Intellectual Property Office, the disclosure of which is incorporated by reference herein in its entirety.

BACKGROUND

The inventive concepts relates to non-volatile memory devices, and more particularly, to three-dimensional (3D) non-volatile memory devices including a plurality of memory cells repeatedly arranged three-dimensionally.

Due to the development of electronic technology, the downscaling of semiconductor devices has rapidly progressed. A high integration density has been required to increase the storage capacity of semiconductor memory devices used in electronic devices. In particular, it is necessary to develop techniques related to a three-dimensional (3D) non-volatile memory device having a structure capable of ensuring reliability required by memory cells even when the number of memory cells, which are stacked on a substrate and overlap each other in a vertical direction, increases.

SUMMARY

At least one embodiment relates to a three-dimensional (3D) non-volatile memory device having a structure, which may be advantageous for miniaturization and high integration of a memory cell array having a 3D structure and obtain reliability required by memory cells overlapping in a vertical direction on a substrate in the memory cell array having the 3D structure even when the stacked number of memory cells is increased.

According to an aspect of the inventive concepts, there is provided a 3D non-volatile memory device including a memory cell array, which includes a plurality of memory cells repeatedly arranged in a first lateral direction, a second lateral direction, and a vertical direction on a substrate. The first lateral direction and the second lateral direction are parallel to a main surface of the substrate and perpendicular to each other, and the vertical direction is perpendicular to the main surface of the substrate. The memory cell array includes a plurality of horizontal channel regions extending in the first lateral direction on the substrate. The plurality of horizontal channel regions overlap each other and are apart from each other in the vertical direction. A vertical word line passes through the plurality of horizontal channel regions in the vertical direction.

According to another aspect of the inventive concepts, there is provided a 3D non-volatile memory device including a substrate having a main surface. A plurality of horizontal channel regions overlap each other and are apart from each other in a vertical direction on the substrate. Each of the horizontal channel region extends parallel to the main surface of the substrate. A plurality of inter-cell insulation patterns are respectively one by one between the plurality of horizontal channel regions. A plurality of vertical word lines pass through the plurality of horizontal channel regions and the plurality of inter-cell insulation patterns in the vertical direction. Each of the plurality of horizontal channel regions includes a plurality of ring channel portions and a plurality of connection portions. The plurality of ring channel portions are regularly arranged in a first lateral direction, and the plurality of connection portions are respectively between the plurality of ring channel portions. The plurality of ring channel portions define a plurality of first local holes located apart from each other. The plurality of inter-cell insulation patterns include a plurality of second local holes, which are aligned with the plurality of first local holes in the vertical direction. The plurality of vertical word lines pass through the plurality of horizontal channel regions and the plurality of inter-cell insulation patterns in the vertical direction via the plurality of first local holes and the plurality of second local holes.

According to another aspect of the inventive concepts, there is provided a 3D non-volatile memory device includes a substrate having a main surface. A memory cell array includes a plurality of memory cell strings. Each of the memory cell strings extends in a first lateral direction that is parallel to the main surface of the substrate. The plurality of memory cell strings are repeatedly arranged in a second lateral direction and a vertical direction. The second lateral direction is parallel to the main surface of the substrate and perpendicular to the first lateral direction. The vertical direction is perpendicular to the main surface of the substrate. Each of a plurality of bit lines is connected to one side of a corresponding one of the plurality of memory cell strings. The plurality of bit lines overlap each other and are apart from each other in the vertical direction. At least one source line is apart from the plurality of bit lines with the plurality of memory cell strings therebetween in the first lateral direction. The at least one source line is connected to another side of each of the plurality of memory cell strings. Each of the plurality of memory cell strings includes a horizontal channel region including a plurality of ring channel portions and a plurality of connection portions. The plurality of ring channel portions are regularly arranged in the first lateral direction. The plurality of connection portions are respectively between the plurality of ring channel portions. The plurality of ring channel portions define a plurality of local holes located apart from each other. A plurality of vertical word lines pass through the horizontal channel region in the vertical direction via the plurality of local holes.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1A:
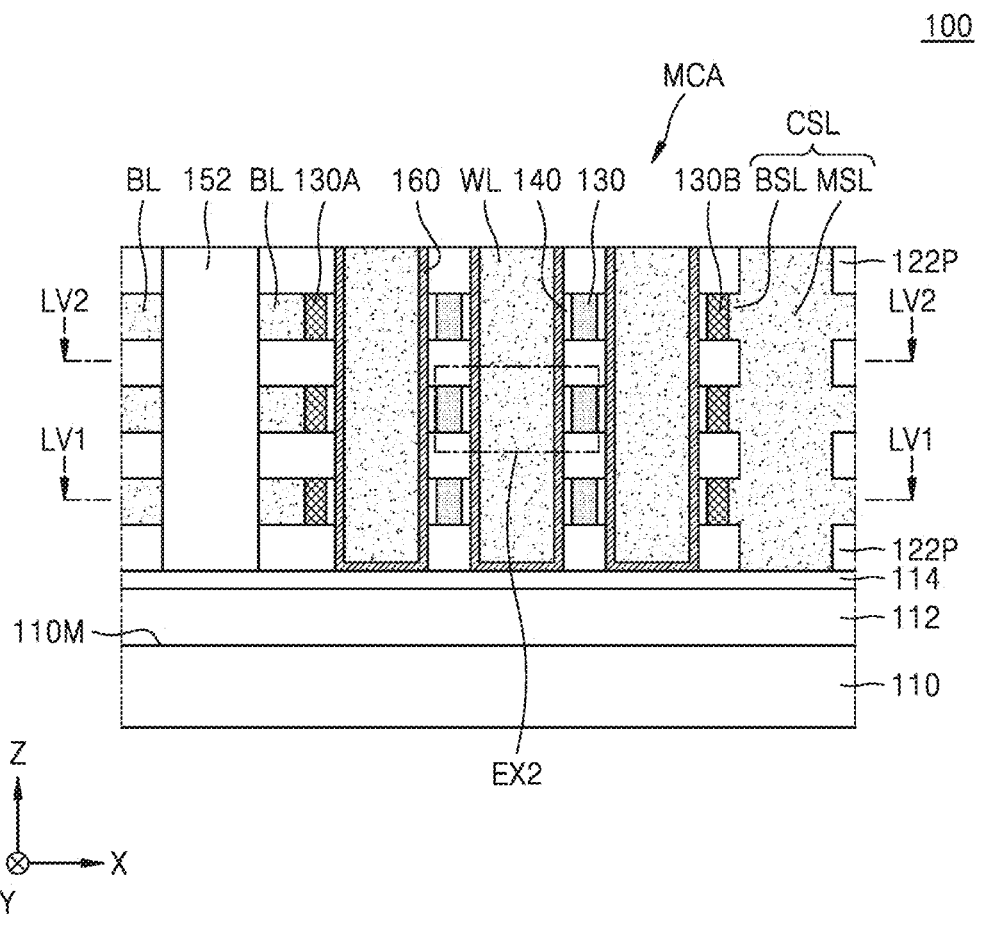
FIG. 1A is a cross-sectional view of a three-dimensional (3D) non-volatile memory device according to example embodiments.

Hereinafter, example embodiments of the inventive concepts will be described in detail with reference to the accompanying drawings. Like reference numerals in the accompanying drawings refer to like elements throughout, and duplicate descriptions thereof are omitted.

Figure 1B:
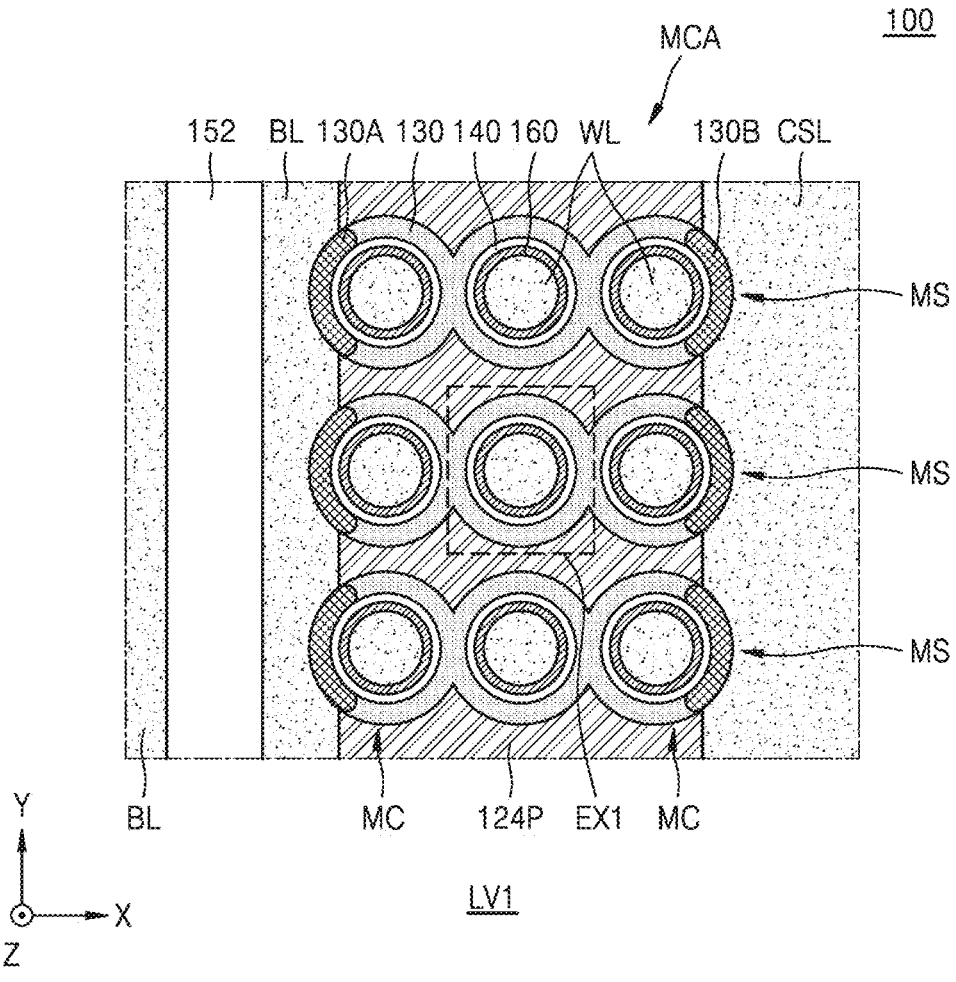
FIG. 1B is a plan view of a configuration at a first vertical level in the 3D non-volatile memory device shown in FIG. 1A.
Figure 1C:
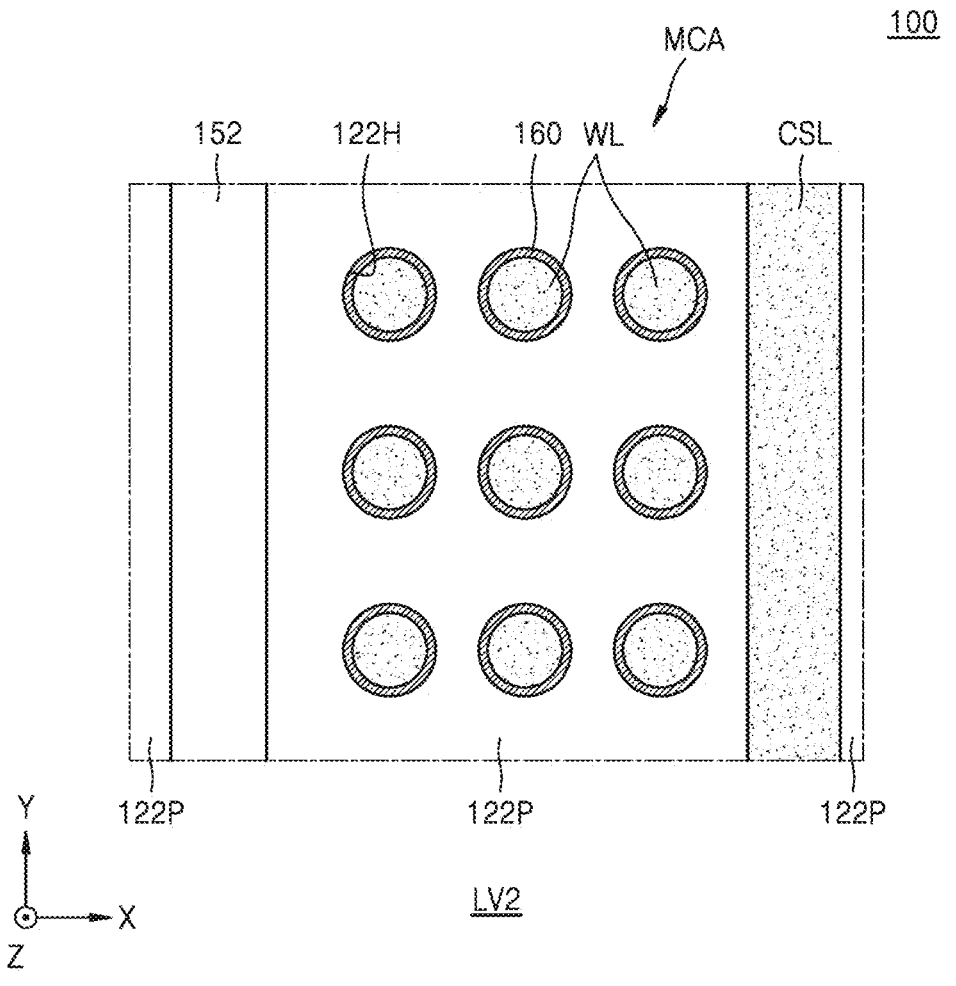
FIG. 1C is a plan view of a configuration at a second vertical level in the 3D non-volatile memory device shown in FIG. 1A.
Figure 1D:
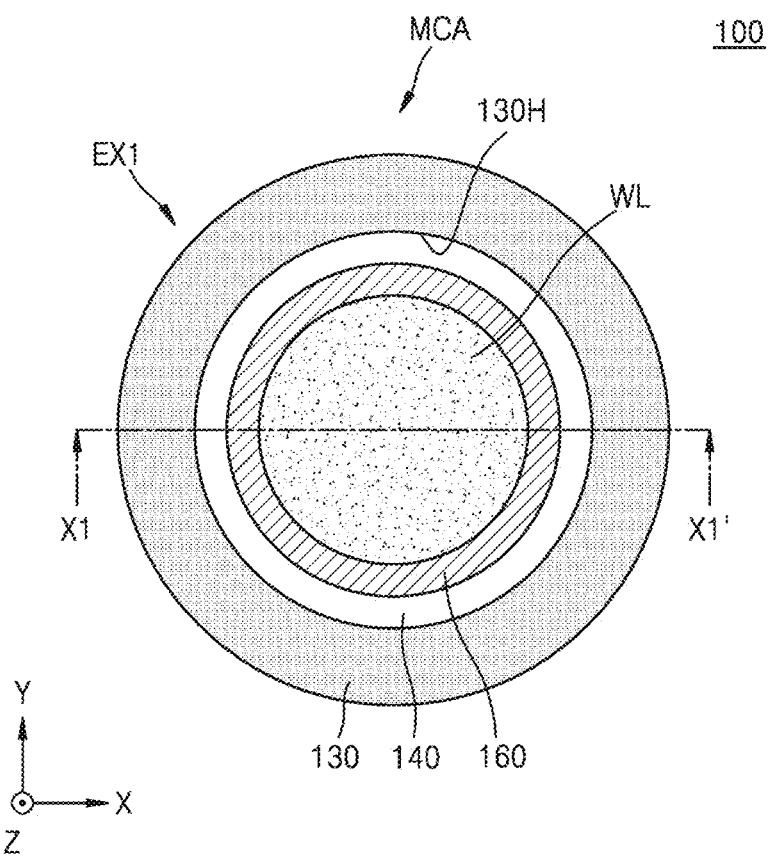
FIG. 1D is a partial enlarged plan view of portion "EX1" of FIG. 1B.
Figure 1E:
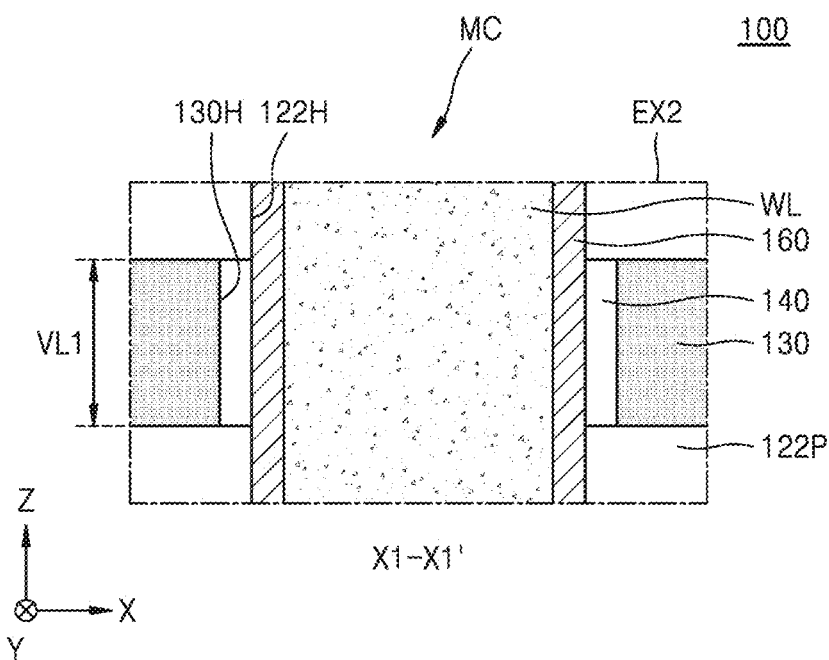
FIG. 1E is a partial enlarged cross-sectional view of portion "EX2" of FIG. 1A, which is taken along line X1-X1' of FIG. 1D.
Figure 1F:
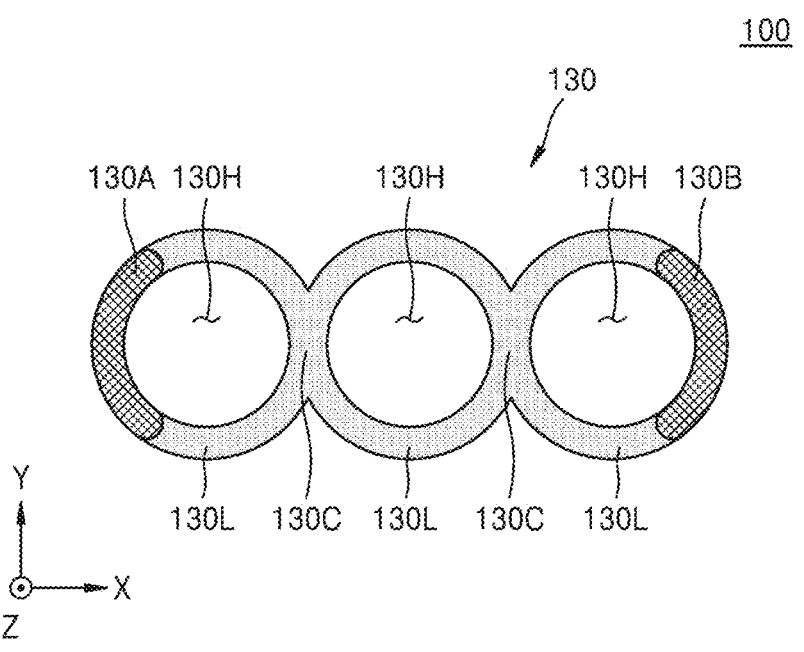
FIG. 1F is an enlarged plan view of a horizontal channel region included in the 3D non-volatile memory device shown in FIG. 1A.
Figure 2:
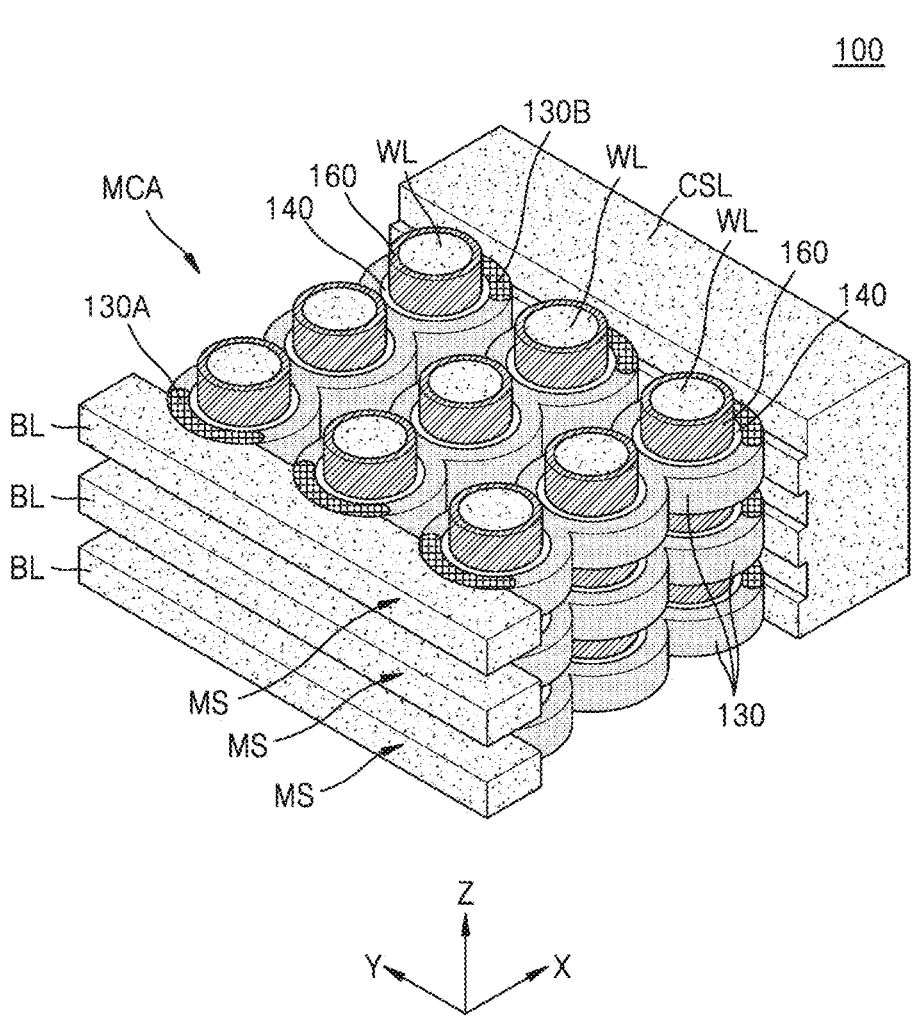
FIG. 2 is a perspective view of a partial region of the 3D non-volatile memory device shown in FIG. 1A.

FIGS. 1A to 1F and 2 are diagrams of a three-dimensional (3D) non-volatile memory device 100 according to example embodiments. More specifically, FIG. 1A is a cross-sectional view of the 3D non-volatile memory device 100. FIG. 1B is a plan view of a configuration at a first vertical level LV1 on a substrate 110 in FIG. 1A. FIG. 1C is a plan view of a configuration at a second vertical level LV2 on the substrate 110 in FIG. 1A. FIG. 1D is a partial enlarged plan view of portion "EX1" of FIG. 1B. FIG. 1E is a partial enlarged cross-sectional view of portion "EX2" of FIG. 1A, which is taken along line X1-X1' of FIG. 1D. FIG. 1F is an enlarged plan view of a horizontal channel region 130 included in the 3D non-volatile memory device 100. FIG. 2 is a perspective view of a partial region of the 3D non-volatile memory device 100 shown in FIG. 1A.

Referring to FIGS. 1A to 1F and 2, the 3D non-volatile memory device 100 may include the substrate 110 having a main surface 110M and a memory cell array MCA on the substrate 110.

The memory cell array MCA may include a plurality of memory cell strings MS, which may extend long in a first lateral direction (X direction) on the substrate 110. The first lateral direction (X direction) may be parallel to the main surface 110M of the substrate 110. The plurality of memory cell strings MS may be repeatedly arranged in a second lateral direction (Y direction) and a vertical direction (Z direction). The second lateral direction (Y direction) may be parallel to the main surface 110M of the substrate 110 and perpendicular to the first lateral direction (X direction). The vertical direction (Z direction) may be perpendicular to the main surface 110M of the substrate 110.

The memory cell array MCA may include a plurality of bit lines BL on one side of the plurality of memory cell strings MS. The plurality of bit lines BL may overlap each other and be apart from each other in the vertical direction (Z direction). Each of the plurality of bit lines BL may extend long in the second lateral direction (Y direction). Each of the plurality of bit lines BL may be connected to one side of a corresponding one of a first group of memory cell strings MS, which are on the same plane at the same vertical level on the substrate 110, from among the plurality of memory cell strings MS. One bit line BL may be shared among the first group of memory cell strings MS.

The memory cell array MCA may include a common source line CSL on the other side of each of the plurality of memory cell strings MS. The common source line CSL may be apart from the plurality of bit lines BL with the plurality of memory cell strings MS therebetween in the first lateral direction (X direction). The common source line CSL may include a main source line portion MSL and a plurality of branched source line portions BSL. The main source line portion MSL may extend long in the second lateral direction (Y direction) on the substrate 110. The plurality of branched source line portions BSL may be branched from the main source line portion MSL toward the horizontal channel region 130 and respectively in contact with the horizontal channel regions 130 of the plurality of memory cell strings MS. In example embodiments, the plurality of branched source line portions BSL may be omitted. In this case, the main source line portion MSL may be in direct contact with the horizontal channel region 130 of each of the plurality of memory cell strings MS.

Each of the plurality of memory cell strings MS may include the horizontal channel region 130 having a planar shape, which extends long in the first lateral direction (X direction), and a plurality of vertical word lines WL, which pass through the horizontal channel region 130.

As shown in FIG. 1F, the horizontal channel region 130 may include a plurality of ring channel portions 130L and a plurality of connection portions 130C. The plurality of ring channel portions 130L may respectively define a plurality of local holes 130H. The plurality of connection portions 130C may be respectively one by one between the plurality of ring channel portions 130L such that two adjacent ones of the plurality of ring channel portions 130L are connected to each other. The plurality of local holes 130H may be regularly arranged in the first lateral direction (X direction) and apart from each other.

As shown in FIG. 1F, the plurality of ring channel portions 130L and the plurality of connection portions 130C may be repeatedly arranged in a straight line that extends in the first lateral direction (X direction). However, the inventive concepts are not limited to that shown in FIG. 1F, and various modifications and changes may be made within the scope thereof. For example, the plurality of ring channel portions 130L and the plurality of connection portions 130C may be repeatedly arranged in zigzag in the first lateral direction (X direction). The plurality of vertical word lines WL may pass through the horizontal channel region 130 in the vertical direction (Z direction) via the plurality of local holes 130H formed in the horizontal channel region 130.

As shown in FIGS. 1A, 1B, and 1F, the horizontal channel region 130 may include first and second ohmic contact portions 130A and 130B at both ends in the first lateral direction (X direction). The horizontal channel region 130 may include the first ohmic contact portion 130A in contact with the bit line BL and the second ohmic contact portion 130B in contact with the common source line CSL. In other example embodiments, the horizontal channel region 130 may not include the first and second ohmic contact portions 130A and 130B.

In example embodiments, a plurality of horizontal channel regions 130 may include undoped polysilicon, doped polysilicon, compound semiconductor material, oxide semiconductor material, two-dimensional (2D) semiconductor material, or a combination thereof. The compound semiconductor material may be selected from a Group IV-IV compound semiconductor, a Group III-V compound semiconductor, a Group II-VI compound semiconductor, and a Group IV-VI compound semiconductor. The Group IV-IV compound semiconductor may be selected from silicon germanium (SiGe), silicon carbide (SiC), silicon germanium carbide (SiGeC), germanium tin (GeSn), silicon tin (SiSn), and silicon germanium tin (SiGeSn). The Group III-V compound semiconductor may include a compound semiconductor including at least one of indium (In), gallium (Ga), and aluminum (Al) as a Group III element and at least one element of arsenide (As), phosphorus (P), and antimony (Sb) as a Group V element. The Group III-V compound semiconductor may include a binary, ternary, or quaternary compound including two, three, or four elements selected from Group III and V elements. The binary compound may be selected from indium phosphide (InP), gallium arsenide (GaAs), gallium phosphide (GaP), indium arsenide (InAs), indium antimonide (InSb), and gallium antimonide (GaSb), and the ternary compound may be selected from InGaP, InGaAs, AlInAs, InGaSb, GaAsSb, and GaAsP, without being limited thereto. The Group II-VI compound semiconductor may include a binary, ternary, or quaternary compound including two, three, or four elements selected from Group II and VI elements. The Group II-VI compound semiconductor may be selected from cadmium selenide (CdSe), zinc telluride (ZnTe), cadmium sulfide (CdS), zinc sulfide (ZnS), zinc selenide (ZnSe), and mercury cadmium telluride (HgCdTe), without being limited thereto. The Group IV-VI compound semiconductor may include lead sulfide (PbS), without being limited thereto.

The oxide semiconductor material may be selected from InGaZnO (IGZO), Sn-IGZO, InWO (IWO), InZnO (IZO), ZnSnO (ZTO), ZnO, yttrium-doped zinc oxide (YZO), InGaSiO (IGZO), InO, SnO, TiO, ZnON, magnesium zinc oxide (MgZnO), ZrInZnO, HfInZnO, SnInZnO, AlSnInZnO, SiInZnO, AlZnSnO, GaZnSnO, and ZrZnSnO, without being limited thereto.

In example embodiments, the 2D semiconductor material may include a transition metal dichalcogenide or a bipolar semiconductor material using both electrons and holes as driving charges. For example, the 2D semiconductor material may be selected from $MoS_2$, $MoSe_2$, $WS_2$, $NbS_2$, $TaS_2$, $ZrS_2$, $HfS_2$, $TcS_2$, $ReS_2$, $CuS_2$, $GaS_2$, $InS_2$, $SnS_2$, $GeS_2$, $PbS_2$, $WSe_2$, $NbSe_2$, $TaSe_2$, $ZrSe_2$, $HfSe_2$, $TcSe_2$, $ReSe_2$, $CuSe_2$, $GaSe_2$, $InSe_2$, $SnSe_2$, $GeSe_2$, $PbSe_2$, $MoTe_2$, $WTe_2$, $NbTe_2$, $TaTe_2$, $ZrTe_2$, $HfTe_2$, $TcTe_2$, $ReTe_2$, $CuTe_2$, $GaTe_2$, $InTe_2$, $SnTe_2$, $GeTe_2$, and $PbTe_2$, without being limited thereto.

As used herein, each of the materials described above refers to a material including elements included in respective terms, without referring to a chemical formula representing a stoichiometric relationship.

In example embodiments, the plurality of horizontal channel regions 130 may include doped polysilicon. In this case, as shown in FIGS. 1A, 1B, and 1F, each of the plurality of horizontal channel regions 130 may include the first and second ohmic contact portions 130A and 130B. Here, the first and second ohmic contact portions 130A and 130B may have a higher dopant concentration than the remaining portion of the horizontal channel region 130. In other example embodiments, the plurality of horizontal channel regions 130 may include an oxide semiconductor material or a 2D material. In this case, the plurality of horizontal channel regions 130 may not include the first and second ohmic contact portions 130A and 130B.

As shown in FIGS. 1B and 2, in the memory cell array MCA, a plurality of memory cells MC may be repeatedly arranged in the first lateral direction (X direction), the second lateral direction (Y direction), and the vertical direction (Z direction). Each of the plurality of memory cell strings MS may include a plurality of memory cells MC, which are regularly arranged in the first lateral direction (X direction).

As shown in FIG. 2, the memory cell array MCA may include a first group of horizontal channel regions 130, which are apart from each other in the vertical direction (Z direction) and overlap each other. From among the plurality of vertical word lines WL, a first group of vertical word lines WL arranged in a line in the first lateral direction (X direction) may pass through the first group of horizontal channel regions 130 in the vertical direction (Z direction). From among the plurality of memory cell strings MS, a second group of memory cell strings MS, which overlap each other and are apart from each other in the vertical direction (Z direction) on the substrate 110, may share the first group of vertical word lines WL therebetween.

As shown in FIGS. 1A and 1C, the memory cell array MCA may include a plurality of inter-cell insulation patterns 122P, which are respectively one by one between the plurality of horizontal channel regions 130 in the vertical direction (Z direction) and overlap the plurality of horizontal channel regions 130 in the vertical direction (Z direction). The plurality of inter-cell insulation patterns 122P may be respectively one by one between the first group of horizontal channel regions 130, which overlap each other and are apart from each other in the vertical direction (Z direction) on the substrate 110. A plurality of local holes 122H may be respectively formed in the plurality of inter-cell insulation patterns 122P. each of the plurality of local holes 122H may be aligned with the local hole 130H of each of the plurality of horizontal channel regions 130 in the vertical direction (Z direction). The plurality of vertical word lines WL may pass through the plurality of inter-cell insulation patterns 122P and the plurality of horizontal channel regions 130 in the vertical direction (Z direction) via the plurality of local holes 122H and 130H.

Each of the plurality of vertical word lines WL may include a plurality of first local regions surrounded by the plurality of horizontal channel regions 130 and a plurality of second local regions surrounded by the plurality of inter-cell insulation patterns 122P. In the plurality of vertical word lines WL, the plurality of first local regions and the plurality of second local regions may be alternately arranged one by one in the vertical direction (Z direction).

As shown in FIG. 1B, the memory cell array MCA may include a plurality of inter-string insulation patterns 124P at the same vertical level as the plurality of horizontal channel regions 130. The inter-string insulation pattern 124P may be between the first group of memory cell strings MS, which are on the same plane at the same vertical level on the substrate 110, from among the plurality of memory cell strings MS. The inter-string insulation pattern 124P may be between two adjacent memory cell strings MS, from among the first group of memory cell strings MS, and provide a separation distance therebetween. In the memory cell array MCA, the plurality of inter-string insulation patterns 124P, which are on the same plane at the same vertical level on the substrate 110, may each have a sidewall in contact with the horizontal channel region 130 adjacent thereto, a sidewall in contact with the bit line BL, and a sidewall in contact with the common source line CSL.

The inter-string insulation pattern 124P may include a material having an etch selectivity with respect to a material of the inter-cell insulation pattern 122P. In example embodiments, the inter-cell insulation pattern 122P may include a silicon oxide film, and the inter-string insulation pattern 124P may include a silicon nitride film, without being limited thereto.

As shown in FIGS. 1A to 1E and 2, the memory cell array MCA may include a plurality of ferroelectric layers 160 and a plurality of interface dielectric layers 140. Each of the plurality of ferroelectric layers 160 and the plurality of interface dielectric layers 140 may have a ring shape in a view from above (e.g., on an X-Y plane).

Each of the plurality of ferroelectric layers 160 may be between the vertical word line WL and the horizontal channel region 130. Each of the plurality of ferroelectric layers 160 may pass through the first group of horizontal channel regions 130 and a first group of inter-cell insulation patterns 122P, which overlap each other and are apart from each other in the vertical direction (Z direction), in the vertical direction (Z direction), via the plurality of local holes 130H and a plurality of local holes 122H.

Each of the plurality of ferroelectric layers 160 may surround the outer surface of the vertical word line WL along the circumference of the vertical word line WL and be in contact with the outer surface of the vertical word line WL. Each of the plurality of ferroelectric layers 160 may have a cylindrical shape, which surrounds the vertical word line WL and extends long in the vertical direction (Z direction). One vertical word line WL and one ferroelectric layer 160 may be shared among the plurality of memory cells MC, which overlap each other in the vertical direction (Z direction).

The plurality of interface dielectric layers 140 may be at the same vertical level as the plurality of horizontal channel regions 130 on the substrate 110. In each of the plurality of memory cells MC, the interface dielectric layer 140 may be between the ferroelectric layer 160 and the horizontal channel region 130. As shown in FIGS. 1A and 1E, the inter-cell insulation pattern 122P may be between a first group of interface dielectric layers 140, which overlap each other and are apart from each other in the vertical direction (Z direction) on the substrate 110, from among the plurality of interface dielectric layers 140.

As shown in FIG. 1E, each of the horizontal channel region 130 and the interface dielectric layer 140 may pass through the local hole 130H of the horizontal channel region 130 in the vertical direction (Z direction) without passing through the local hole 122H of the inter-cell insulation pattern 122P. The horizontal channel region 130 and the interface dielectric layer 140 may be in a space defined by two inter-cell insulation patterns 122P, which are apart from each other in the vertical direction (Z direction), from among the plurality of inter-cell insulation patterns 122P that surround the vertical word line WL and the ferroelectric layer 160. Each of the horizontal channel region 130 and the interface dielectric layer 140 may have a maximum vertical length VL1, which is defined by two inter-cell insulation patterns 122P, which are adjacent to each other in the vertical direction (Z direction).

In other example embodiments, similar to the vertical word line WL and the ferroelectric layer 160, the interface dielectric layer 140 may pass through the local hole 130H of the horizontal channel region 130 and the local hole 122H of the inter-cell insulation pattern 122P and extend long in the vertical direction (Z direction). In this case, one interface dielectric layer 140 may be shared among the plurality of memory cells MC, which overlap each other in the vertical direction (Z direction).

In example embodiments, the plurality of ferroelectric layers 160 may include at least one selected from hafnium (Hf), silicon (Si), aluminum (Al), zirconium (Zr), yttrium (Y), lanthanum (La), gadolinium (Gd), and strontium (Sr). For example, the plurality of ferroelectric layers 160 may include a hafnium-based oxide, for example, hafnium oxide (HfO), hafnium zirconium oxide (HZO), hafnium titanium oxide, or hafnium silicon oxide. A ferroelectric film 160 may further include a dopant as needed. The dopant may include at least one element selected from silicon (Si), aluminum (Al), zirconium (Zr), yttrium (Y), lanthanum (La), gadolinium (Gd), scandium (Sc), strontium (Sr), magnesium (Mg), and barium (Ba), without being limited thereto. In other example embodiments, each of the plurality of ferroelectric layers 160 may have a stack structure including a plurality of ferroelectric sub-layers including different materials. In yet other example embodiments, the plurality of ferroelectric layers 160 may include a stacked structure of at least one ferroelectric sub-layer and a dielectric layer. A constituent material of each of the ferroelectric sub-layers may be selected from the above-described examples of a constituent material of the plurality of ferroelectric layers 160. The dielectric layer may include a silicon oxide film, a high-k dielectric film, or a combination thereof. The high-k dielectric film may include a metal oxide or metal oxynitride having a higher dielectric constant than the silicon oxide film. The plurality of interface dielectric layers 140 may include a silicon oxide film, without being limited thereto.

Each of the plurality of vertical word lines WL, the plurality of bit lines BL, and the common source line CSL may include a metal, a conductive metal nitride, a conductive semiconductor material, or a combination thereof. In example embodiments, each of the plurality of vertical word lines WL, the plurality of bit lines BL, and the common source line CSL may include tungsten (W), aluminum (Al), copper (Cu), cobalt (Co), molybdenum (Mo), titanium (Ti), tantalum (Ta), titanium nitride (TiN), tantalum nitride (TaN), tungsten nitride (WN), tungsten carbonitride (WCN), titanium silicon nitride (TiSiN), tantalum silicon nitride (TaSiN), tungsten silicon nitride (WSiN), or a combination thereof, without being limited thereto.

As shown in FIG. 1A, a lower insulating film 112 and an etch stop layer 114 may be between the substrate 110 and the memory cell array MCA. In example embodiments, the lower insulating film 112 may include a silicon oxide film, and the etch stop layer 114 may include an aluminum oxide film, without being limited thereto.

As shown in FIGS. 1A, 1B, and 1C, a side portion of the memory cell array MCA, which is adjacent to the plurality of bit lines BL, may be covered by an isolation insulating film 152. A pair of memory cell arrays MCA, which are adjacent to each other in the first lateral direction (X direction) with the plurality of bit lines BL therebetween, may be electrically separable from each other by the isolation insulating film 152 and have a symmetrical structure about the isolation insulating film 152. The isolation insulating film 152 may include a silicon nitride film, a silicon oxide film, or a combination thereof, without being limited thereto.

The memory cell array MCA of the 3D non-volatile memory device 100 described with reference to FIGS. 1A to 1F and 2 pertains to an example configuration in which, in each of the plurality of memory cell strings MS between the plurality of bit lines BL and the common source line CSL, three vertical word lines WL pass through one horizontal channel region 130, one horizontal channel region 130 is shared among three memory cells MC, and one bit line BL is shared among three memory cell strings MS. However, the inventive concepts are not limited thereto. For example, each of the number of vertical word lines WL passing through one horizontal channel region 130, the number of memory cells MC among which one horizontal channel region 130 is shared, and the number of memory cell strings MS among which one bit line BL is shared may be variously selected as needed.

The 3D non-volatile memory device 100 described with reference to FIGS. 1A to 1F and 2 may include the plurality of horizontal channel regions 130, which overlap each other and are apart from each other in the vertical direction, and a plurality of vertical word lines WL, which pass through the plurality of horizontal channel regions 130 in the vertical direction (Z direction). The 3D non-volatile memory device 100 may have a channel-all-around structure in which the plurality of horizontal channel regions 130 surround one vertical word line WL in transistors among which the vertical word line WL is shared. Accordingly, when an electric field is applied form the vertical word line WL to the horizontal channel region 130 during an operation of the 3D non-volatile memory device 100, the electric field may be prevented from concentrating into the interface dielectric layer 140 between the vertical word line WL and the horizontal channel region 130, or there may be a reduction of concentration of the electric field into the interface dielectric layer 140 between the vertical word line WL and the horizontal channel region 130. In addition, by sequentially interposing the interface dielectric layer 140 and the ferroelectric layer 160 between the horizontal channel region 130 and the vertical word line WL, a structure capable of increasing an electric field applied to the ferroelectric layer 160 while preventing or reducing the concentration of the electric field into the interface dielectric layer 140 during the operation of the 3D non-volatile memory device 100 may be implemented. Therefore, dipole switching efficiency may be improved. Accordingly, the 3D non-volatile memory device 100 may obtain a relatively large memory window and have improved reliability.

In addition, in the 3D non-volatile memory device 100, the plurality of memory cell strings MS may have a structure extending long in a lateral direction (e.g., X direction) in a lengthwise direction of each of the plurality of horizontal channel regions 130. Therefore, in the 3D non-volatile memory device 100, even when the number of memory cells MC stacked in the vertical direction (Z direction) is increased, problems, such as worst on cell current (WOC)

degradation, may be prevented or reduced, and each of the plurality of memory cells MC may provide excellent operating characteristics.

Figure 3:
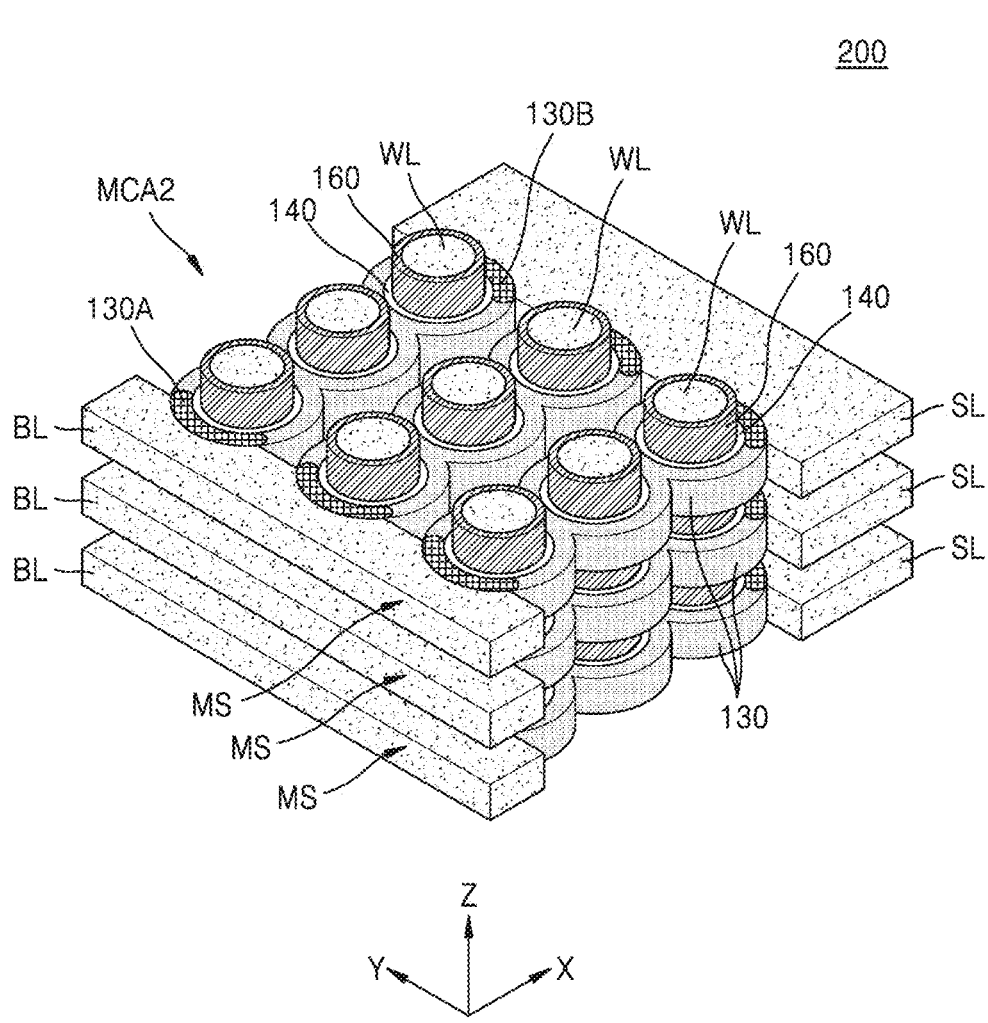
FIG. 3 is a perspective view of a 3D non-volatile memory device according to example embodiments.

FIG. 3 is a perspective view of a 3D non-volatile memory device 200 according to example embodiments.

Referring to FIG. 3, the 3D non-volatile memory device 200 may have substantially the same configuration as the 3D non-volatile memory device 100 described with reference to FIGS. 1A to 1F and 2. However, a memory cell array MCA2 of the 3D non-volatile memory device 200 may include a plurality of source lines SL instead of the common source line CSL.

The plurality of source lines SL may overlap each other and are apart from each other in a vertical direction (Z direction). For example, the plurality of source lines SL may not touch one another in the Z direction. Each of the plurality of source lines SL may be connected to one side of a corresponding one of a first group of memory cell strings MS, which are on the same plane at the same vertical level on a substrate 110, from among a plurality of memory cell strings MS included in one memory cell array MCA2. Each of the plurality of source lines SL may be shared among the first group of memory cell strings MS. A constituent material of the plurality of source lines SL may be the same as a constituent material of the common source line CSL shown in FIGS. 1A to 1C and 2.

Figure 4:
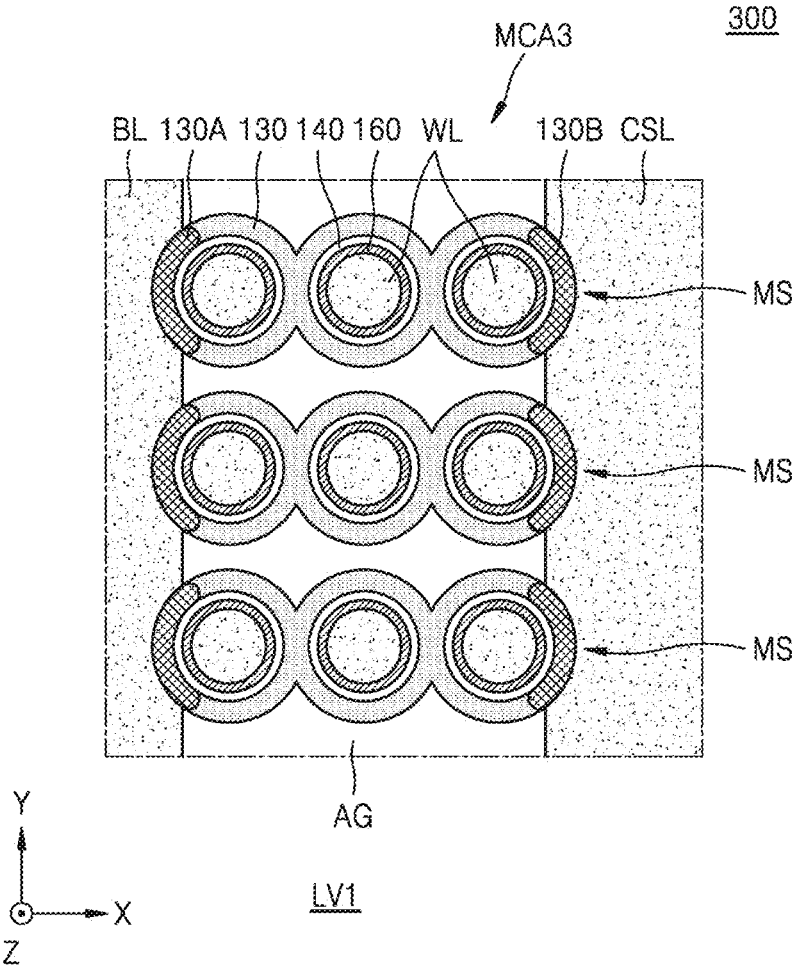
FIG. 4 is a plan view of a 3D non-volatile memory device according to example embodiments.

FIG. 4 is a plan view of a 3D non-volatile memory device 300 according to example embodiments.

Referring to FIG. 4, the 3D non-volatile memory device 300 may have substantially the same configuration as the 3D non-volatile memory device 100 described with reference to FIGS. 1A to 1F and 2. However, a memory cell array MCA3 of the 3D non-volatile memory device 300 may include an air gap AG instead of the inter-string insulation pattern 124P. As used herein, the term "air" refers to the atmosphere or other gases that may be present during a manufacturing process.

The air gap AG may be between two adjacent memory cell strings MS of a first group of memory cell strings MS, which are on the same plane at the same vertical level on a substrate 110, from among a plurality of memory cell strings MS included in one memory cell array MCA3, and provide a separation distance therebetween. In the memory cell array MCA3, a partial region of each of a plurality of horizontal channel regions 130, a bit line BL, and a common source line CSL may be exposed in the air gap AG.

Figure 5:
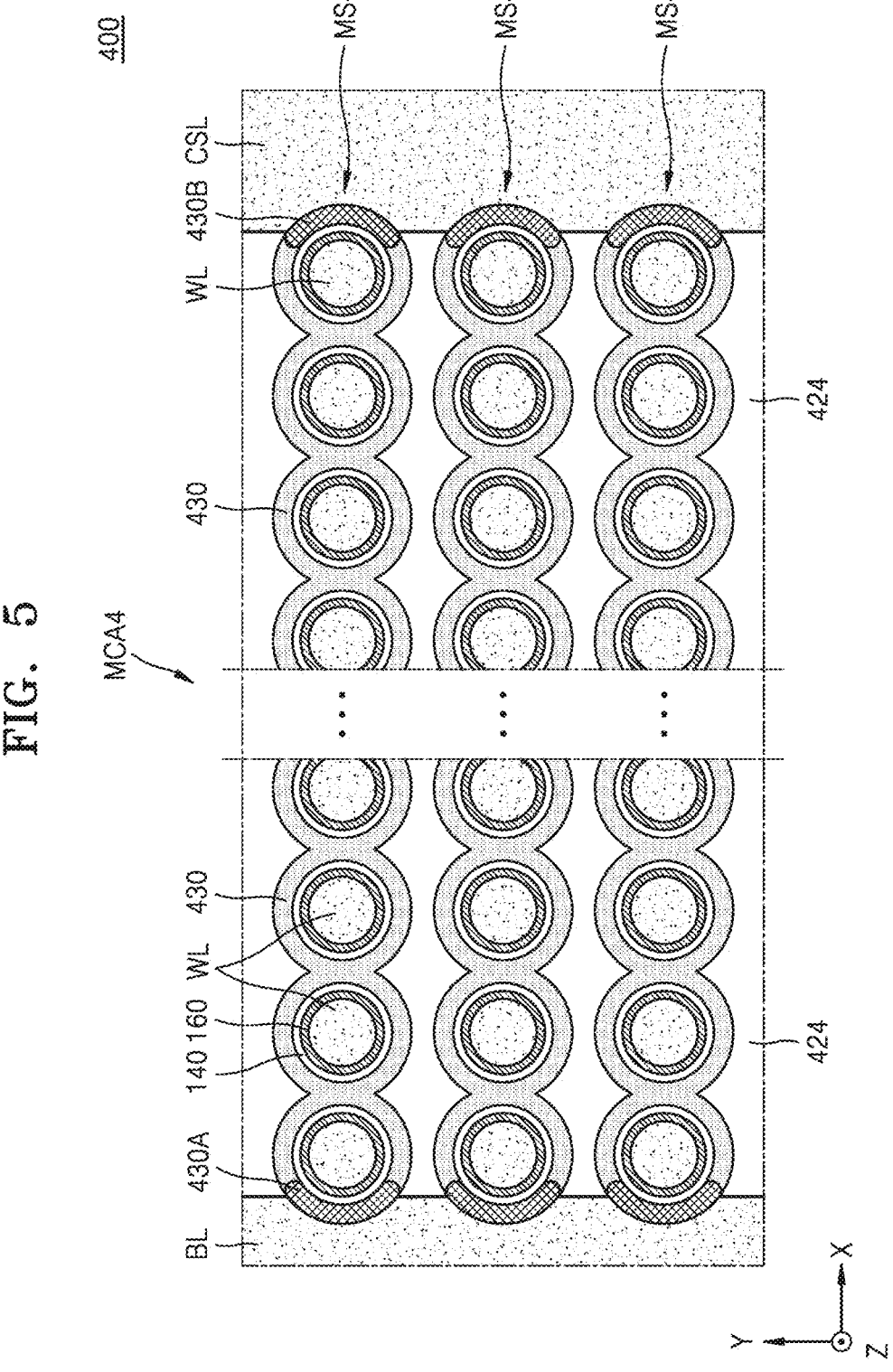
FIG. 5 is a plan view of a 3D non-volatile memory device according to example embodiments.

FIG. 5 is a plan view of a 3D non-volatile memory device 400 according to example embodiments.

Referring to FIG. 5, the 3D non-volatile memory device 400 may have substantially the same configuration as the 3D non-volatile memory device 100 described with reference to FIGS. 1A to 1F and 2. However, in a memory cell array MCA4 of the 3D non-volatile memory device 400, a plurality of memory cell strings MS4 may extend long in a first lateral direction (X direction) between a bit line BL and a common source line CSL, and each of the plurality of memory cell strings MS4 may include one horizontal channel region 430.

The horizontal channel region 430 may include first and second ohmic contact portions 430A and 430B, which are at both ends in the first lateral direction (X direction). The horizontal channel region 430 may include the first ohmic contact portion 430A in contact with the bit line BL and the second ohmic contact portion 430B in contact with the common source line CSL. In other example embodiments, the horizontal channel region 430 may not include the first and second ohmic contact portions 430A and 430B.

In each of the plurality of memory cell strings MS4, the plurality of vertical word lines WL may pass through one horizontal channel region 430 in a vertical direction (Z direction). Here, the number of vertical word lines WL that pass through one horizontal channel region 430 may be at least 4. The plurality of vertical word lines WL that pass through one horizontal channel region 430 may be arranged in a straight line in the first lateral direction (X direction).

An inter-string insulation pattern 424 may be between a first group of memory cell strings MS4, which are on the same plane (e.g., an X-Y plane) at the same vertical level, from among the plurality of memory cell strings MS4. The inter-string insulation pattern 424 may be between two adjacent ones of the first group of memory cell strings MS4 and provide a separation distance therebetween. The inter-string insulation pattern 424 may include a silicon nitride film, an air gap, or a combination thereof.

A detailed description of the plurality of memory cell strings MS4 and the horizontal channel region 430 may be substantially the same as that of the plurality of memory cell strings MS and the horizontal channel region 130 of the memory cell array MCA, which has been described with reference to FIGS. 1A to 1F and 2.

Figure 6:
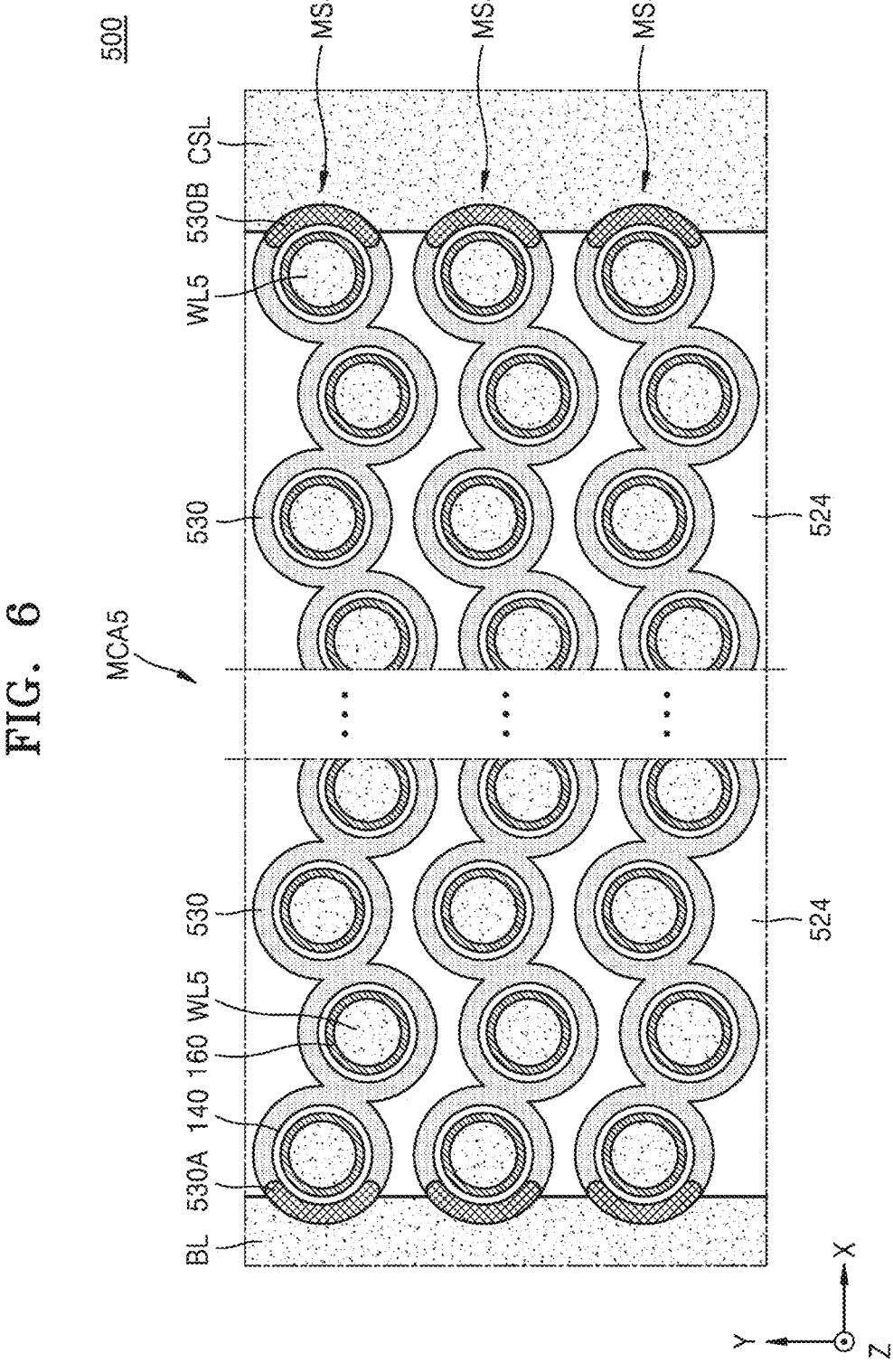
FIG. 6 is a plan view of a 3D non-volatile memory device according to example embodiments.

FIG. 6 is a plan view of a 3D non-volatile memory device 500 according to example embodiments.

Referring to FIG. 6, the 3D non-volatile memory device 500 may have substantially the same configuration as the 3D non-volatile memory device 100 described with reference to FIGS. 1A to 1F and 2. However, in a memory cell array MCA5 of the 3D non-volatile memory device 500, a plurality of memory cell strings MS5 may extend long in a first lateral direction (X direction) between a bit line BL and a common source line CSL, and each of the plurality of memory cell strings MS5 may include one horizontal channel region 530.

The horizontal channel region 530 may include first and second ohmic contact portions 530A and 530B, which are at both ends in the first lateral direction (X direction). The horizontal channel region 530 may include the first ohmic contact portion 530A in contact with the bit line BL and the second ohmic contact portion 530B in contact with the common source line CSL. In other example embodiments, the horizontal channel region 530 may not include the first and second ohmic contact portions 530A and 530B.

In each of the plurality of memory cell strings MS5, the plurality of vertical word lines WL may pass through one horizontal channel region 530 in a vertical direction (Z direction). Here, the number of vertical word lines WL that pass through one horizontal channel region 530 may be at least 4. The plurality of vertical word lines WL, which pass through one horizontal channel region 530, may be arranged in zigzag in the first lateral direction (X direction). For example, a zigzag pattern may have a center of each the vertical word lines WL alternate between a positive offset in the second lateral direction (Y direction) and a negative offset in the second lateral direction. In some example embodiments, this offset is such that the centers of each of the vertical word lines WL may overlap an adjacent vertical word line WL in the first lateral direction, be aligned with an outer periphery of an adjacent vertical word line WL in the first lateral direction, or not overlap an adjacent vertical word line WL in the first lateral direction.

An inter-string insulation pattern 524 may be between a first group of memory cell strings MS5, which are on the same plane (e.g., an X-Y plane) at the same vertical level, from among the plurality of memory cell strings MS5. The inter-string insulation pattern 524 may be between two adjacent memory cell strings MS5 of the first group of memory cell strings MS5, and provide a separation distance therebetween. The inter-string insulation pattern 524 may include a silicon nitride film, an air gap, or a combination thereof.

Detailed descriptions of the plurality of memory cell strings MS5 and the horizontal channel region 530 may be substantially the same as those of the plurality of memory cell strings MS and the horizontal channel region 130 of the memory cell array MCA, which have been provided with reference to FIGS. 1A to 1F and 2.

In the 3D non-volatile memory device 500 shown in FIG. 6, the plurality of vertical word lines WL that pass through one horizontal channel region 530 may be arranged in zigzag in the first lateral direction (X direction), and thus, the size of the 3D non-volatile memory device 500 in the first lateral direction (X direction) may be further reduced. Therefore, a structure that is advantageous for increasing the integration density of the 3D non-volatile memory device 500 may be provided.

Figure 7A:
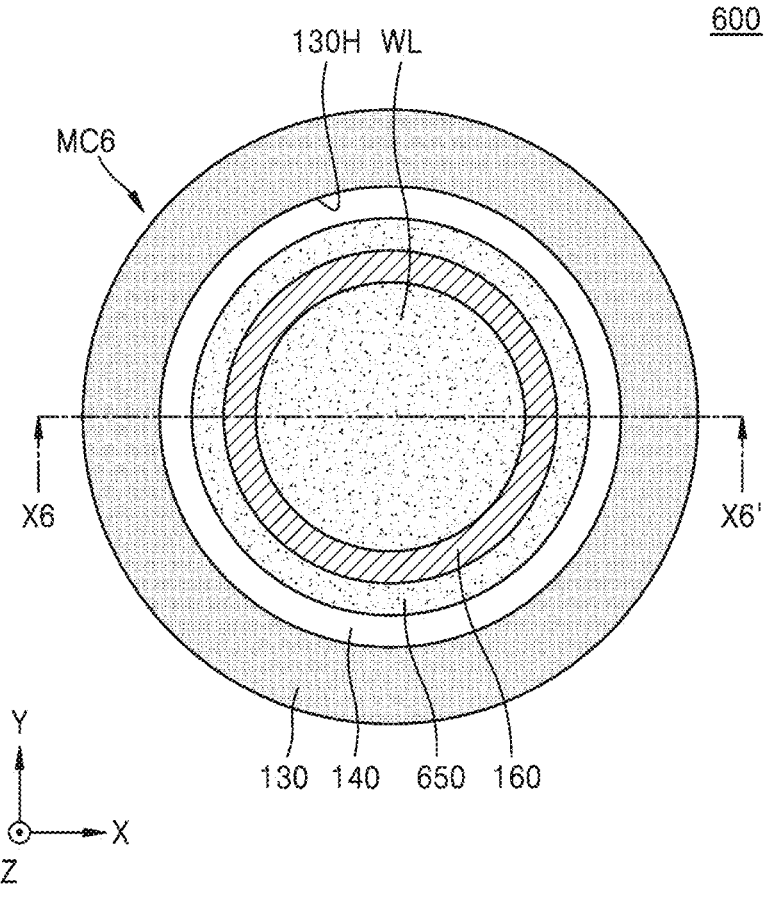
FIG. 7A is a partial enlarged plan view of a portion corresponding to portion "EX1" of FIG. 1B in a 3D non-volatile memory device according to example embodiments.
Figure 7B:
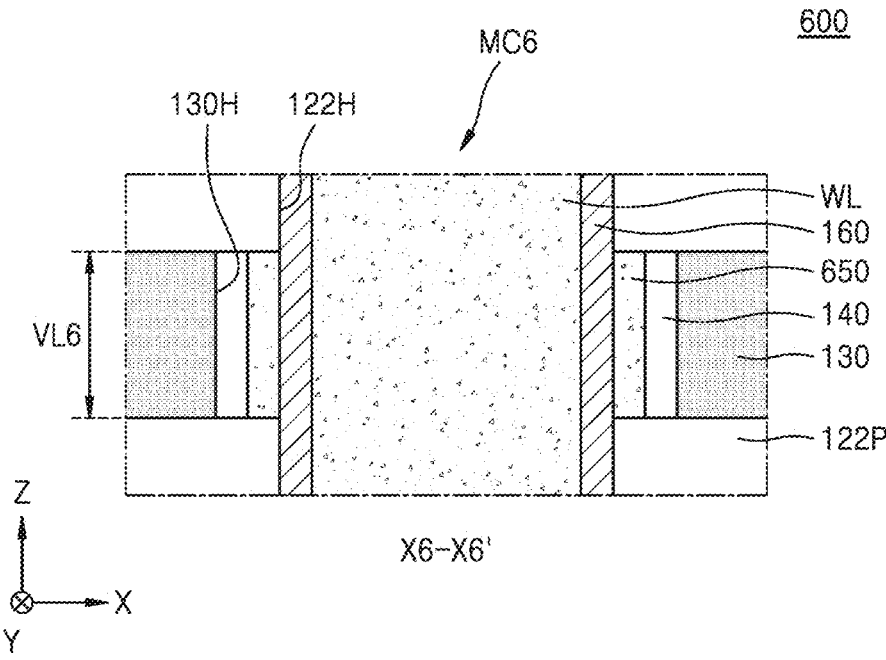
FIG. 7B is a cross-sectional view taken along line X6-X6' of FIG. 7A.

FIGS. 7A and 7B are diagrams of a 3D non-volatile memory device 600 according to example embodiments. More specifically, FIG. 7A is a partial enlarged plan view of a portion corresponding to portion "EX1" of FIG. 1B in the 3D non-volatile memory device 600. FIG. 7B is a partial enlarged cross-sectional view of a portion corresponding to portion "EX2" of FIG. 1A. FIG. 7B is a cross-sectional view taken along line X6-X6' of FIG. 7A.

Referring to FIGS. 7A and 7B, the 3D non-volatile memory device 600 may have substantially the same configuration as the 3D non-volatile memory device 100 described with reference to FIGS. 1A to 1F and 2. However, the 3D non-volatile memory device 600 may include a memory cell MC6 instead of the memory cell MC. The memory cell MC6 may include a metal-containing pattern 650 between an interface dielectric layer 140 and a ferroelectric layer 160.

The metal-containing pattern 650 may be at the same vertical level as the interface dielectric layer 140 and a horizontal channel region 130. In the 3D non-volatile memory device 600, each of the horizontal channel region 130, the interface dielectric layer 140, and the metal-containing pattern 650 may pass through a local hole 130H of the horizontal channel region 130 in a vertical direction (Z direction) without passing through the local hole 122H of the inter-cell insulation pattern 122P.

The horizontal channel region 130, the interface dielectric layer 140, and the metal-containing pattern 650 may be in a space defined by two inter-cell insulation patterns 122P, which are adjacent to each other in the vertical direction (Z direction), from among the plurality of inter-cell insulation patterns 122P that surround a vertical word line WL and the ferroelectric layer 160. Each of the horizontal channel region 130, the interface dielectric layer 140, and the metal-containing pattern 650 may have a maximum vertical length VL6, which is defined by two inter-cell insulation patterns 122P, which are adjacent to each other in the vertical direction (Z direction).

The metal-containing pattern 650 may have a ring shape in a view from above (e.g., on an X-Y plane). Each of the lower surface and the upper surface of the metal-containing pattern 650 may be covered by the inter-cell insulation pattern 122P. A material of the metal-containing pattern 650 may be substantially the same as a material of the vertical word line WL, which has been described with reference to FIGS. 1A to 1E and 2.

In the 3D non-volatile memory device 600 shown in FIGS. 7A and 7B, the ferroelectric layer 160 may pass through the horizontal channel region 130 in the vertical direction (Z direction) between the vertical word line WL and the metal-containing pattern 650. The inner surface of the ferroelectric layer 160 may be in contact with the vertical word line WL, and a local surface of the outer surface of the ferroelectric layer 160, which faces the horizontal channel region 130, may be in contact with the metal-containing pattern 650.

In the memory cell MC6 of the 3D non-volatile memory device 600 shown in FIGS. 7A and 7B, by interposing the metal-containing pattern 650 between the interface dielectric layer 140 and the ferroelectric layer 160, during an operation of the 3D non-volatile memory device 600, when an electric field is applied from the vertical word line WL to the horizontal channel region 130, the concentration of the electric field into the interface dielectric layer 140 may be prevented or reduced effectively. Also, the ferroelectric layer 160 may be in contact with the vertical word line WL and the metal-containing pattern 650. Accordingly, when the vertical word line WL includes a metal film or a metal-containing film, ferroelectric properties of the ferroelectric layer 160 may be further improved. For instance, when the ferroelectric layer 160 includes a ferroelectric material, which is based on a material, such as $HfO_2$ and $ZrO_2$ or the like, and each of the vertical word line WL and the metal-containing pattern 650 includes, for example, a TiN film in contact with the ferroelectric layer 160, strain exerted by the vertical word line WL and the metal-containing pattern 650 on the ferroelectric layer 160 may favorably act in maintaining an orthorhombic phase (o-phase) in the ferroelectric layer 160. Therefore, ferroelectric characteristics of the ferroelectric layer 160 may be optimized. Accordingly, the reliability of the 3D non-volatile memory device 600 may be further improved. For example, the vertical word line WL may include a tungsten (W) plug and a titanium nitride (TiN) barrier film, which surrounds the W plug and is in contact with the ferroelectric layer 160, the metal-containing pattern 650 may include a TiN film, and the ferroelectric layer 160 may include a thin film that is based on a material, such as hafnium oxide and zirconium oxide, without being limited thereto.

Figure 8A:
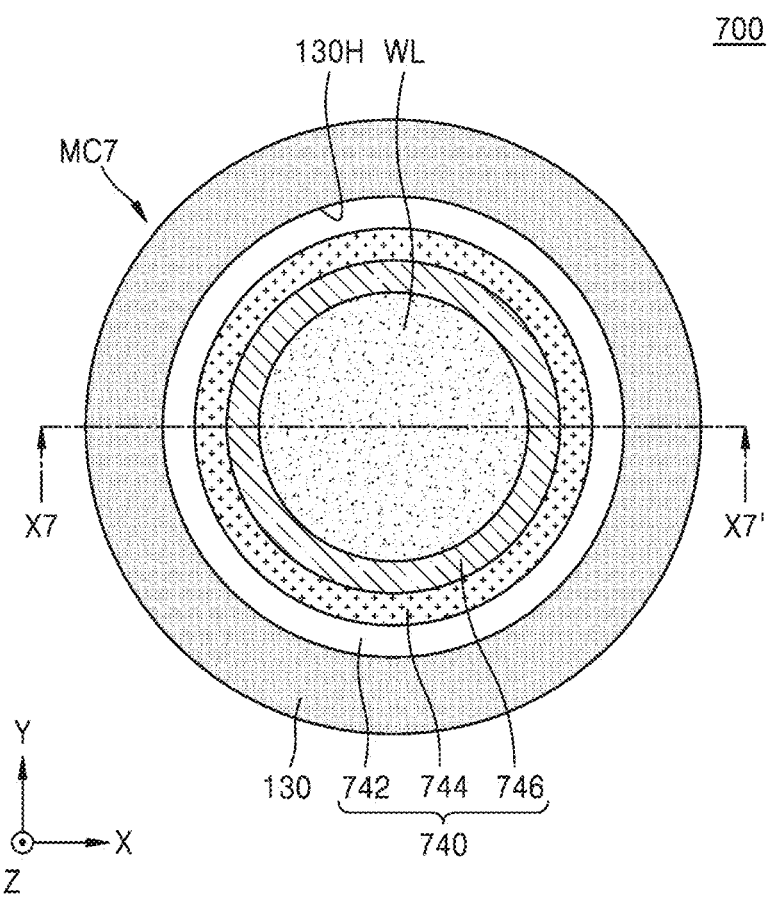
FIG. 8A is a plan view of a 3D non-volatile memory device according to example embodiments.

FIG. 8A is a plan view of a 3D non-volatile memory device 700 according to example embodiments. FIG. 8A illustrates an enlarged planar configuration of a partial region corresponding to portion "EX1" of FIG. 1B in the 3D non-volatile memory device 700.

Referring to FIG. 8A, the 3D non-volatile memory device 700 may have substantially the same configuration as the 3D non-volatile memory device 100 described with reference to FIGS. 1A to 1F and 2. However, the 3D non-volatile memory device 700 may include a memory cell MC7 instead of the memory cell MC. The memory cell MC7 may include a gate dielectric film structure 740 between the vertical word line WL and the horizontal channel region 130.

The gate dielectric film structure 740 may include a tunneling dielectric film 742, a charge storage film 744, and a blocking dielectric film 746, which are sequentially arranged from the inner surface of the horizontal channel region 130 toward the vertical word line WL. The tunneling dielectric film 742, the charge storage film 744, and the blocking dielectric film 746 may pass through the horizontal channel region 130 in the vertical direction (Z direction) via a local hole 130H of the horizontal channel region 130.

In example embodiments, the tunneling dielectric film 742 may include silicon oxide, hafnium oxide, aluminum oxide, zirconium oxide, and/or tantalum oxide. The charge storage film 744 may include silicon nitride, boron nitride, silicon boronitride, and/or doped polysilicon. The blocking dielectric film 746 may include a metal oxide having a higher dielectric constant than silicon oxide, silicon nitride, or silicon oxide. The metal oxide may include hafnium oxide, aluminum oxide, zirconium oxide, tantalum oxide, or a combination thereof. In example embodiments, the blocking dielectric film 746 may include an anti-ferroelectric (AFE) material, such as $ZrO_2$. When the blocking dielectric film 746 includes an AFE material, an effect of lowering an operating voltage of the 3D non-volatile memory device 700 may be provided.

Figure 8B:
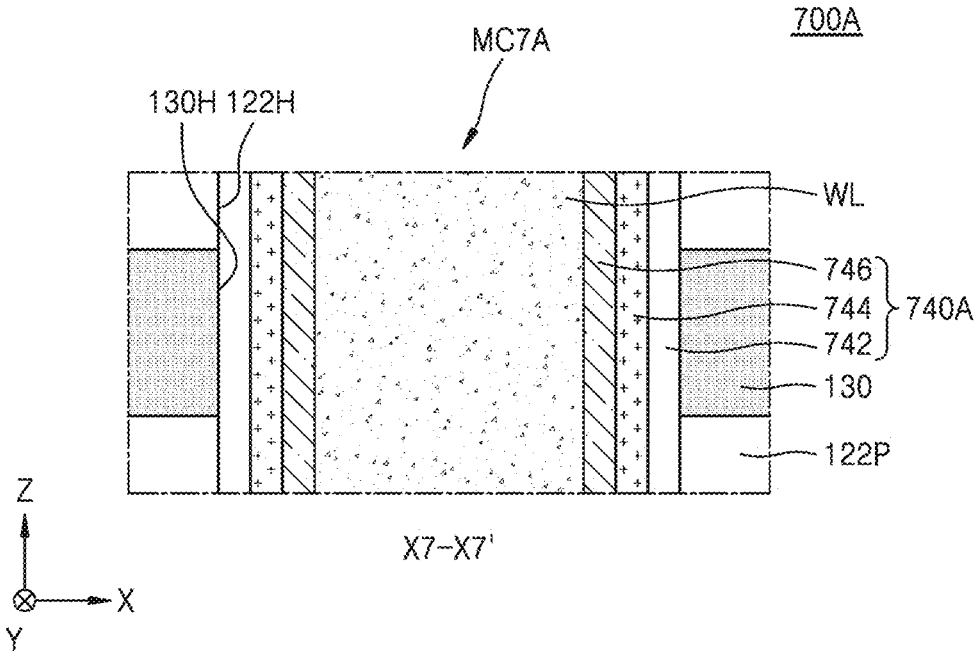
FIGS. 8B and 8C are cross-sectional views of various structures corresponding to a cross-section taken along line X7-X7' of FIG. 8A in a 3D non-volatile memory device according to example embodiments.
Figure 8C:
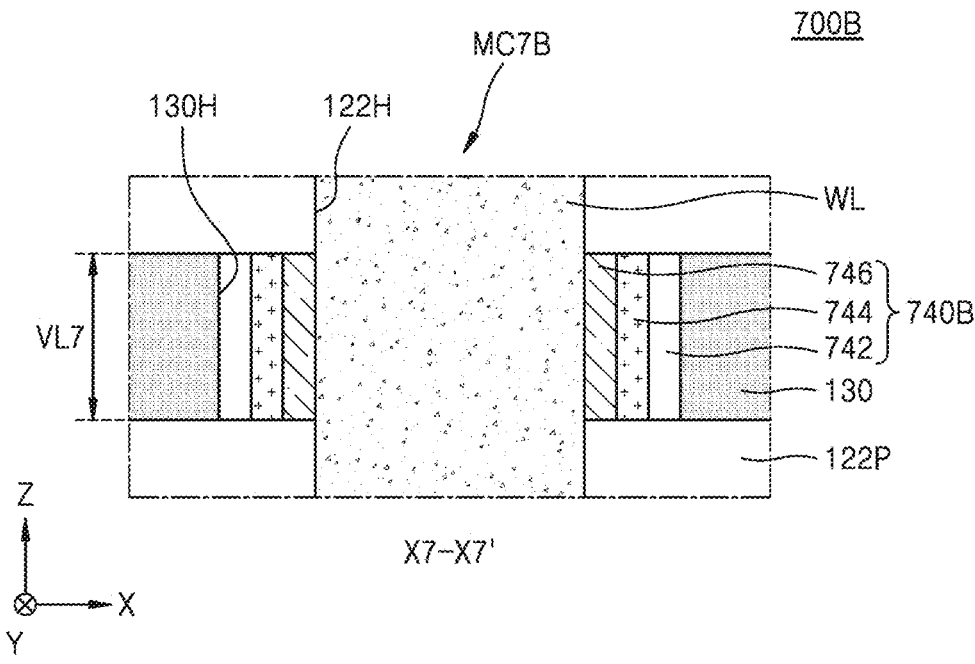

FIGS. 8B and 8C are cross-sectional views of various structures corresponding to a cross-section taken along line X7-X7' of FIG. 8A in 3D non-volatile memory devices 700A and 700B according to example embodiments. FIGS. 8B and 8C illustrate enlarged cross-sectional configurations of a portion corresponding to portion "EX2" of FIG. 1A in the 3D non-volatile memory devices 700A and 700B, respectively.

Referring to FIG. 8B, the 3D non-volatile memory device 700A may have substantially the same configuration as the 3D non-volatile memory device 700 described with reference to FIG. 8A. However, the 3D non-volatile memory device 700A may include a memory cell MC7A including a gate dielectric film structure 740A between a vertical word line WL and a horizontal channel region 130. In the memory cell MC7A, each of a tunneling dielectric film 742, a charge storage film 744, and a blocking dielectric film 746 may pass through the horizontal channel region 130 and an inter-cell insulation pattern 122P in a vertical direction (Z direction) via a local hole 130H of the horizontal channel region 130 and a local hole 122H of the inter-cell insulation pattern 122P.

FIG. 8B illustrates an example in which all of the tunneling dielectric film 742, the charge storage film 744, and the blocking dielectric film 746 pass through the horizontal channel region 130 and the inter-cell insulation pattern 122P in the vertical direction (Z direction), but the inventive concepts are not limited to the example shown in FIG. 8B. In the 3D non-volatile memory device 700A, at least one of the tunneling dielectric film 742, the charge storage film 744, and the blocking dielectric film 746 may pass through the channel region 130 and the inter-cell insulation pattern 122P in the vertical direction (Z direction). At least one of the tunneling dielectric film 742, the charge storage film 744, and the blocking dielectric film 746 may surround the outer surface of the vertical word line WL along the circumference of the vertical word line WL over the total length of the vertical word line WL in the vertical direction (Z direction).

Referring to FIG. 8C, the 3D non-volatile memory device 700B may have substantially the same configuration as the 3D non-volatile memory device 700 described with reference to FIG. 8A. However, in the 3D non-volatile memory device 700B, each of the tunneling dielectric film 742, the charge storage film 744, and the blocking dielectric film 746, which are included in a gate dielectric film structure 740B, may pass through a local hole 130H of the horizontal channel region 130 in the vertical direction (Z direction) without passing through a local hole 122H of an inter-cell insulation pattern 122P. Each of the tunneling dielectric film 742, the charge storage film 744, and the blocking dielectric film 746 may have a maximum vertical length VL7, which is defined by two inter-cell insulation patterns 122P, which are adjacent to each other in the vertical direction (Z direction).

FIG. 8C illustrates an example in which all of the tunneling dielectric film 742, the charge storage film 744, and the blocking dielectric film 746 pass through the horizontal channel region 130 in the vertical direction (Z direction) without passing through the inter-cell insulation pattern 122P, but the inventive concepts are not limited to the example shown in FIG. 8C. In the 3D non-volatile memory device 700B, at least one of the tunneling dielectric film 742, the charge storage film 744, and the blocking dielectric film 746 may pass through the channel region 130 in the vertical direction (Z direction), but may not pass through the inter-cell insulation pattern 122P.

Each of the 3D non-volatile memory devices 300, 400, 500, 600, and 700 shown in FIGS. 3 to 8 may include a plurality of horizontal channel regions, which overlap each other and are apart from each other, and a plurality of vertical word lines, which pass through the plurality of horizontal channel regions in the vertical direction. In transistors that share the plurality of vertical word lines therebetween, the horizontal channel region may have a channel-all-around structure, which surrounds the vertical word line. Accordingly, a structure capable of preventing or reducing the concentration of an electric field into an interface dielectric layer between the vertical word line and the horizontal channel region when the electric filed is applied from the vertical word line to the horizontal channel region during the operation of the 3D non-volatile memory devices 300, 400, 500, 600, and 700 may be implemented. Therefore, the reliability of the 3D non-volatile memory devices 300, 400, 500, 600, and 700 may be improved. In addition, when a gate dielectric film having a structure including a ferroelectric layer is adopted, a relatively large memory window may be ensured. In the 3D non-volatile memory devices 300, 400, 500, 600, and 700, when the number of memory cells stacked in the vertical direction is increased, problems, such as WOC degradation, may be prevented or reduced, and excellent operating characteristics may be provided.

Figure 9:
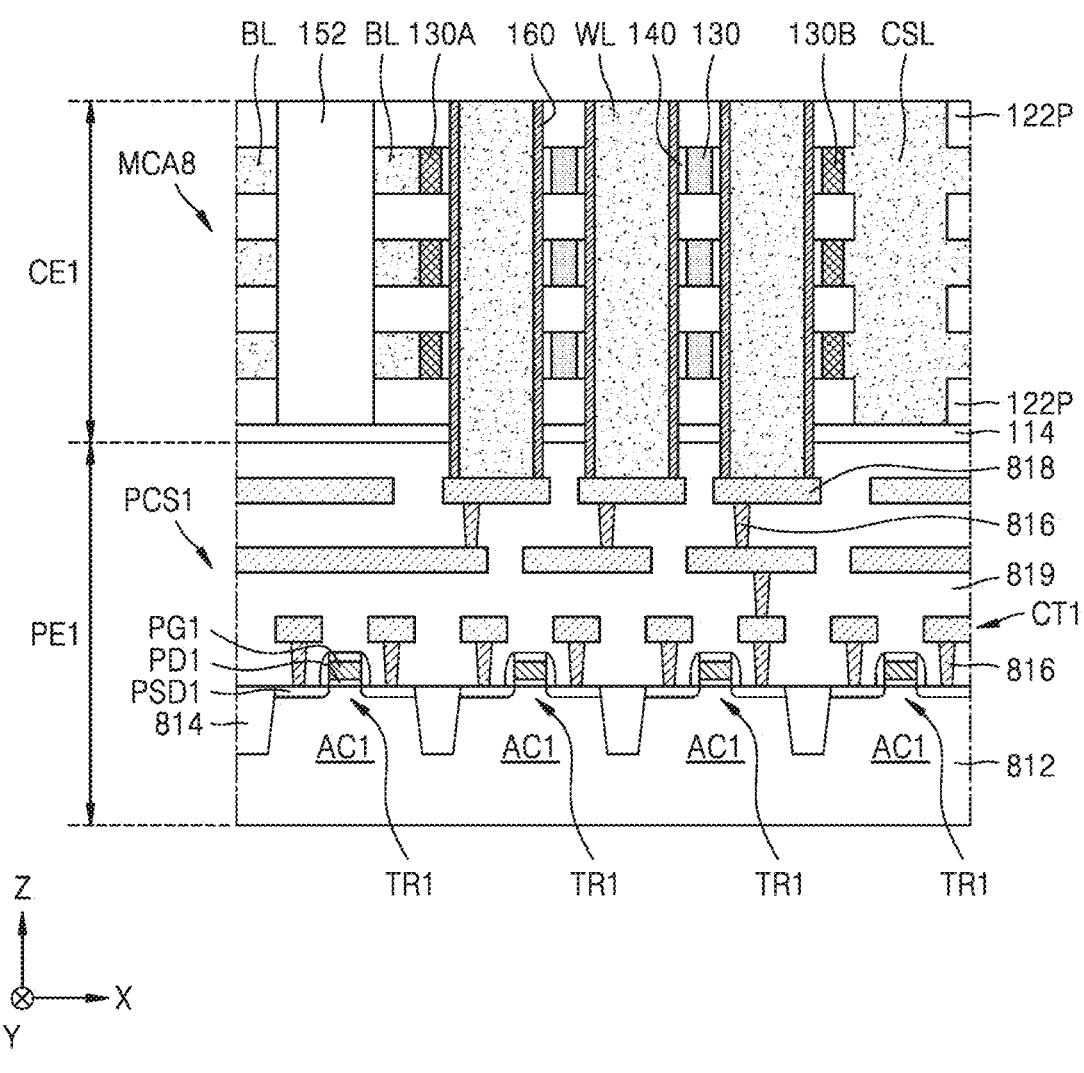
FIG. 9 is a cross-sectional view of a 3D non-volatile memory device according to example embodiments.

FIG. 9 is a cross-sectional view of a 3D non-volatile memory device 800 according to example embodiments.

Referring to FIG. 9, the 3D non-volatile memory device 800 may include a substrate 812, a peripheral circuit region PE1 on the substrate 812, and a cell region CE1 on the peripheral circuit region PE1.

A peripheral circuit structure PCS1 may be in the peripheral circuit region PE1. The cell region CE1 may include a memory cell array MCA8, which overlaps the peripheral circuit region PE1 in a vertical direction (Z direction). The memory cell array MCA8 may have substantially the same configuration as the memory cell array MCA of the 3D non-volatile memory device 100 described with reference to FIGS. 1A to 1F and 2. However, in the memory cell array MCA8, a plurality of vertical word lines WL and a plurality of ferroelectric layers 160 may pass through an etch stop layer 114 and extend to the peripheral circuit region PE1. Each of the plurality of ferroelectric layers 160 may cover an outer sidewall of a vertical word line WL without covering a lower surface of the vertical word line WL.

The peripheral circuit region PE1 may include the substrate 812 and a plurality of circuits CT1 formed on the substrate 812. The plurality of circuits CT1 may be between the substrate 812 and the cell region CE1.

The substrate 812 may include a semiconductor material, for example, a Group IV semiconductor material, a Group III-V compound semiconductor material, or a Group II-VI compound material. In example embodiments, the plurality of circuits CT1 may include a row decoder, a page buffer, a data input/output (I/O) circuit, a control logic, and a common source line driver. In example embodiments, the plurality of circuits CT1 may further include unit elements, such as resistors and capacitors.

A device isolation film 814 defining a plurality of active regions AC1 may be formed in the substrate 812. A plurality of transistors TR1 may be formed on the plurality of active regions AC1, and a plurality of conductive plugs 816 and a plurality of conductive lines 818 may be on the substrate 812 and the plurality of transistors TR1. The plurality of conductive plugs 816 and the plurality of conductive lines 818 may constitute a wiring structure of the peripheral circuit region PE1.

Each of the plurality of transistors TR1 may include a gate dielectric film PD1, a gate electrode PG1, and a pair of source/drain regions PSD1. Each of the plurality of conductive plugs 816 may connect the plurality of transistors TR1 to some selected ones of the plurality of conductive lines 818 in the vertical direction (Z direction). An interlayer insulating film 819 may cover the plurality of transistors TR1, the plurality of conductive plugs 816, and the plurality of conductive lines 818.

In example embodiments, each of the plurality of conductive plugs 816 and the plurality of conductive lines 818 in the peripheral circuit region PE1 may include tungsten, aluminum, copper, or a combination thereof, without being limited thereto. The device isolation film 814 may include a silicon oxide film, a silicon nitride film, or a combination thereof. The interlayer insulating film 819 may include a silicon oxide film, a silicon nitride film, or a combination thereof.

Each of the plurality of transistors TR1, the plurality of conductive plugs 816, and the plurality of conductive lines 818 may constitute some of the plurality of circuits CT1 formed in the peripheral circuit region PE1. Each of the plurality of transistors TR1 may be electrically connectable to the cell region CE1 through the wiring structure of the peripheral circuit region PE1.

The plurality of vertical word lines WL in the memory cell array MCA8 may pass through portions of the etch stop layer 114 and the interlayer insulating film 819 in the vertical direction (Z direction) and be connected to uppermost ones of the plurality of conductive lines 818. In example embodiments, the lower surface of each of the plurality of vertical word lines WL in the memory cell array MCA8 may be in contact with an upper surface of a selected one of the plurality of conductive lines 818.

FIG. 9 illustrates an example configuration in which a portion of the interlayer insulating film 819 is between an upper surface of each of the uppermost ones of the plurality of conductive lines 818 and the etch stop layer 114, but the inventive concepts are not limited to the example shown in FIG. 9. For example, the interlayer insulating film 819 may not be between the upper surface of each of the uppermost ones of the conductive lines 818 and the etch stop layer 114, and the upper surface of each of the uppermost ones of the conductive lines 818 may be in contact with a lower surface of the etch stop layer 114.

Figure 10:
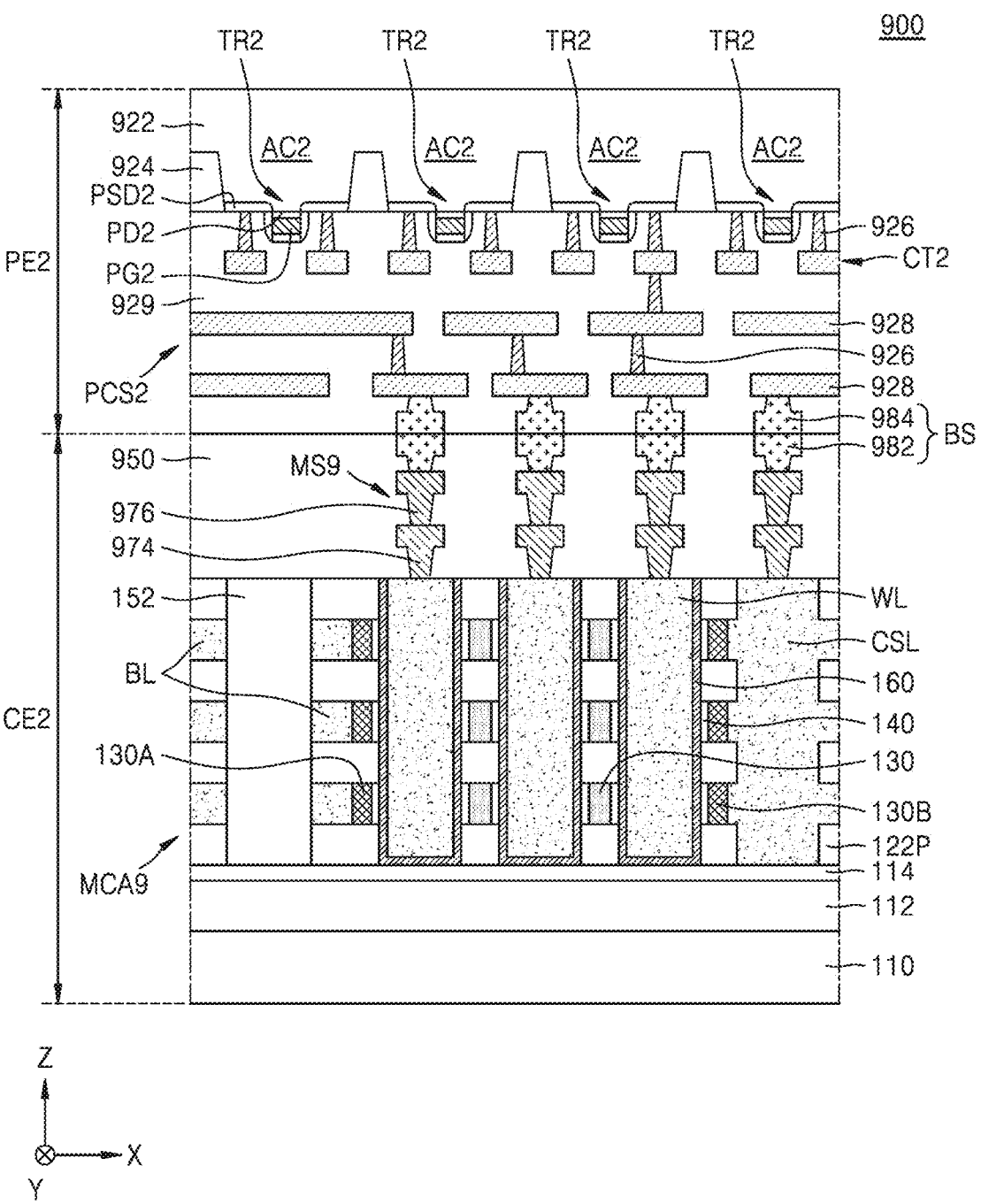
FIG. 10 is a cross-sectional view of a 3D non-volatile memory device according to example embodiments.

FIG. 10 is a cross-sectional view of a 3D non-volatile memory device 900 according to example embodiments.

Referring to FIG. 10, the 3D non-volatile memory device 900 may include a substrate 922, a peripheral circuit region PE2 on the substrate 922, and a cell region CE2 apart from the substrate 922 with the peripheral circuit region PE2 therebetween in a vertical direction. A peripheral circuit structure PCS2 may be in the peripheral circuit region PE2. The cell region CE2 may include a memory cell array MCA9, which overlaps the peripheral circuit region PE2 in the vertical direction (Z direction). The memory cell array MCA9 may have substantially the same configuration as the memory cell array MCA of the 3D non-volatile memory device 100 described with reference to FIGS. 1A to 1F and 2.

The peripheral circuit region PE2 may include the substrate 922 and a plurality of circuits CT2 formed on the substrate 922. The plurality of circuits CT2 may be between the substrate 922 and the cell region CE2. The substrate 922 and the plurality of circuits CT2 may have substantially the same configurations as the substrate 812 and a plurality of circuits CT1) described with reference to FIG. 8. However, a device isolation film 924 defining a plurality of active regions AC2 may be formed in the substrate 922. A plurality of transistors TR2 may be formed on the plurality of active regions AC2, and a plurality of conductive plugs 926 and a plurality of conductive lines 928 may be on the substrate 922 and the plurality of transistors TR2. The plurality of conductive plugs 926 and the plurality of conductive lines 928 may constitute a wiring structure of the peripheral circuit region PE2.

Each of the plurality of transistors TR2 may include a gate dielectric film PD2, a gate electrode PG2, and a pair of source/drain regions PSD2. Each of the plurality of conductive plugs 926 may connect the plurality of transistors TR2 to some selected ones of the plurality of conductive lines 928 in a vertical direction (Z direction). An interlayer insulating film 929 may cover the plurality of transistors TR2, the plurality of conductive plugs 926, and the plurality of conductive lines 928. The interlayer insulating film 929 may include silicon oxide, silicon oxynitride (SiON), silicon oxycarbonitride (SiOCN), or a combination thereof.

Each of the plurality of transistors TR2, the plurality of conductive plugs 926, and the plurality of conductive lines 928 may constitute some of the plurality of circuits CT2 formed in the peripheral circuit region PE2. Each of the plurality of transistors TR2 may be electrically connectable to the cell region CE2 through the wiring structure of the peripheral circuit region PE2.

The 3D non-volatile memory device 900 may have a chip-to-chip (C2C) structure. The formation of the C2C structure may include forming a first chip including the cell region CE2 formed on a first wafer, forming a second chip including the peripheral circuit region PE2 formed on a second wafer, which is different from the first wafer, and connecting the first chip to the second chip by using a bonding method. For example, the bonding method may refer to a bonding method in which a first bonding metal pad 982 formed on an uppermost metal layer of the first chip including the cell region CE2 is electrically connectable to a second bonding metal pad 984 formed on an uppermost metal layer of the second chip including the peripheral circuit region PE2. In example embodiments, when the first bonding metal pad 982 and the second bonding metal pad 984 include copper (Cu), the bonding method may be a Cu—Cu bonding method. In other example embodiments, each of the first bonding metal pad 982 and the second bonding metal pad 984 may include aluminum (Al) or tungsten (W).

The cell region CE2 may include a wiring structure MS9 formed on the memory cell array MCA9 and a plurality of first bonding metal pads 982 on the wiring structure MS9. The wiring structure MS9 may include a first upper wiring layer 974 and a second upper wiring layer 976, which is connected to one end of each of a plurality of vertical word lines WL and the common source line CSL. In the cell region CE2, the wiring structure MS9 and the plurality of first bonding metal pads 982 may be covered by an interlayer insulating film 950. The interlayer insulating film 950 may include a silicon oxide film, a silicon nitride film, or a combination thereof.

The peripheral circuit region PE2 may include a plurality of second bonding metal pads 984 on a wiring structure including the plurality of conductive plugs 926 and the plurality of conductive lines 928. Each of the plurality of second bonding metal pads 984 may be bonded to a selected one of the plurality of first bonding metal pads 982 in the cell region CE2 and electrically connectable to the first bonding metal pad 982. The plurality of first bonding metal pads 982 and the plurality of second bonding metal pads 984 may constitute a plurality of bonding structures BS. An interlayer insulating film 929 may cover the plurality of transistors TR2, the plurality of conductive plugs 926, the plurality of conductive lines 928, and the plurality of second bonding metal pads 984.

In example embodiments, each of the plurality of conductive plugs 926 and the plurality of conductive lines 928 in the peripheral circuit region PE2 may include tungsten, aluminum, copper, or a combination thereof, without being limited thereto. The device isolation film 924 may include a silicon oxide film, a silicon nitride film, or a combination thereof. The interlayer insulating film 929 may include a silicon oxide film, a silicon nitride film, or a combination thereof. Each of the plurality of first bonding metal pads 982 and the plurality of second bonding metal pads 984, which constitute the bonding structure BS, may include copper, aluminum, or tungsten.

The plurality of vertical word lines WL, the common source line CSL, and a plurality of bit lines BL in the cell region CE2 may be connected to the circuit CT2 in the peripheral circuit region PE2 through the wiring structure MS9 and the first bonding metal pad 982. FIG. 10 pertains to a case in which the wiring structure MS9 has a double wiring structure including a plurality of first upper wiring layers 974 and a plurality of second upper wiring layers 976, but the inventive concepts are not limited thereto. For example, the wiring structure MS9 may have a single wiring structure or a multilayered wiring structure including at least three layers, which includes the plurality of first upper wiring layers 974 or the plurality of second upper wiring layers 976.

The peripheral circuit region PE2 may be apart from the substrate 110 with the cell region CE2 therebetween in the vertical direction (Z direction).

In the 3D non-volatile memory devices 800 and 900 described with reference to FIGS. 9 and 10, conductive lines (e.g., the plurality of vertical word lines WL) in the cell regions CE1 and CE2 may be connected to the plurality of circuits CT1 and CT2 in the peripheral circuit region PE1 and PE2, which overlap the cell regions CE1 and CE2 in the vertical direction (Z direction). Accordingly, in the 3D non-volatile memory devices 800 and 900, even when the number of horizontal channel regions 130 stacked in the cell regions CE1 and CE2 in the vertical direction (Z direction) is increased and the number of transistors to be formed in the peripheral circuit regions PE1 and PE2 is increased to increase integration density, a degree of freedom for wiring design may be improved in the 3D non-volatile memory devices 800 and 900, and a structure that is advantageous for high integration and a reduction in planar size may be provided.

Hereinafter, a method of manufacturing a 3D non-volatile memory device, according to example embodiments, will be described in detail.

FIGS. 11A to 21B are diagrams of a method of manufacturing a 3D non-volatile memory device, according to example embodiments. Specifically, FIGS. 11A, 12A, 13A, 14A, 15A, 16A, 17A, 18A, 19A, 20A, and 21A are cross-sectional views of a process sequence of a method of manufacturing a 3D non-volatile memory device, according to example embodiments, and FIGS. 11B, 12B, 13B, 14B, 15B, 16B, 17B, 18B, 19B, 20B, and 21B are respectively plan views of configurations of FIGS. 11A, 12A, 13A, 14A, 15A, 16A, 17A, 18A, 19A, 20A, and 21A at a first vertical level LV1 on a substrate 110. A method of manufacturing the 3D non-volatile memory device 100 shown in FIGS. 1A to 1F will be described as an example with reference to FIGS. 11A to 21B. In FIGS. 11A to 21B, the same reference numerals are used to denote the same elements as in FIGS. 1A to 1F, and repeated descriptions thereof are omitted.

Figure 11A:
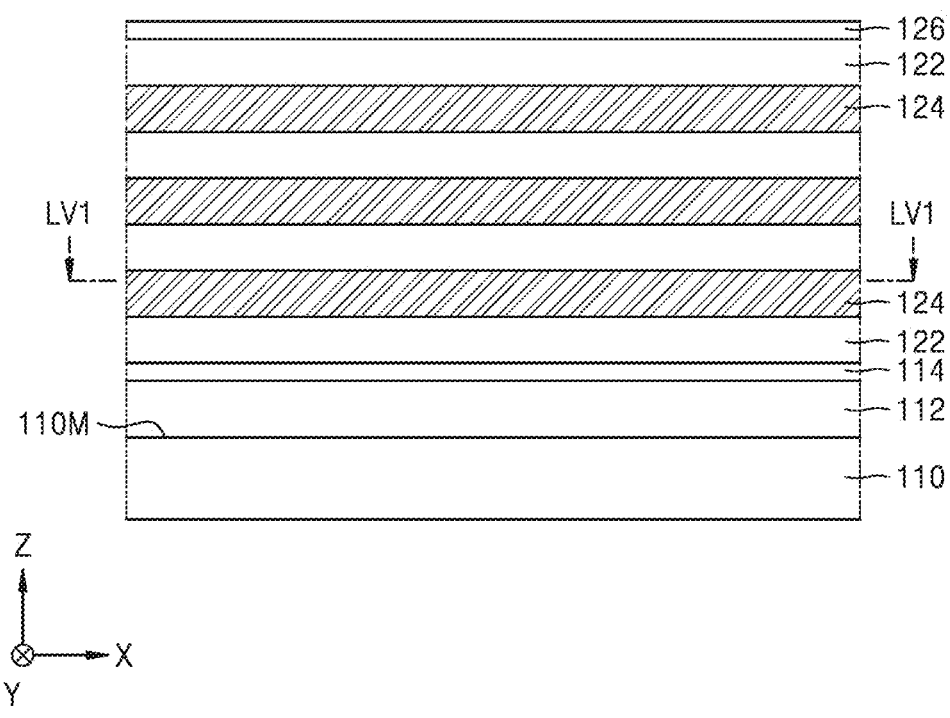
FIGS. 11A, 12A, 13A, 14A, 15A, 16A, 17A, 18A, 19A, 20A, and 21A are cross-sectional views of a process sequence of a method of manufacturing a 3D non-volatile memory device, according to example embodiments.
Figure 11B:
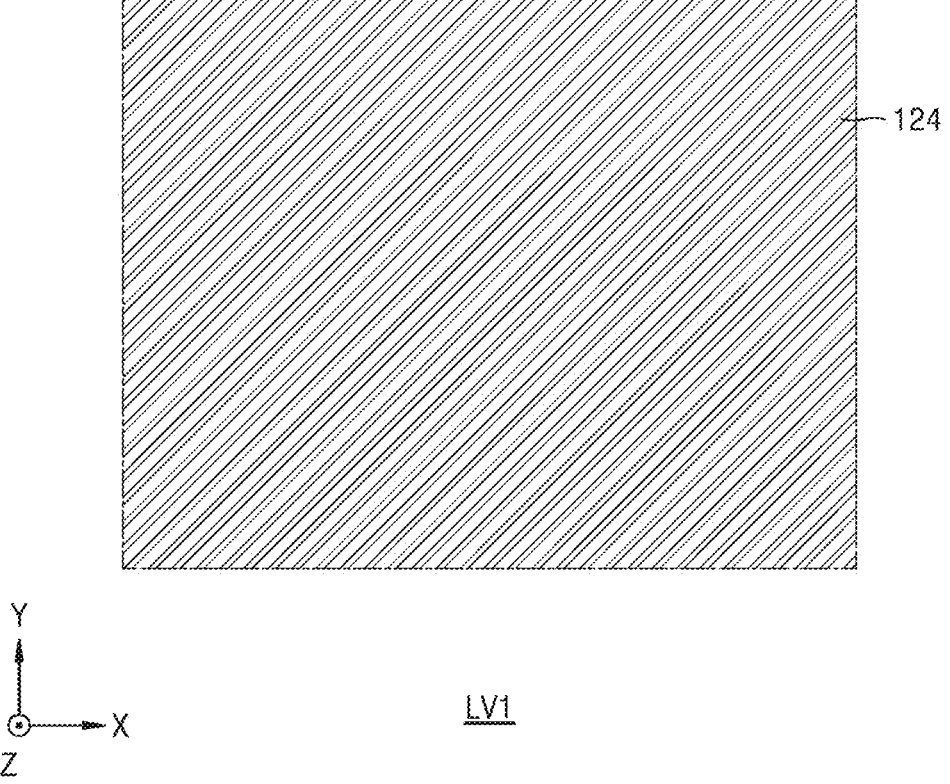
FIGS. 11B, 12B, 13B, 14B, 15B, 16B, 17B, 18B, 19B, 20B, and 21B are respectively plan views of configurations of FIGS. 11A, 12A, 13A, 14A, 15A, 16A, 17A, 18A, 19A, 20A, and 21A at a first vertical level.

Referring to FIGS. 11A and 11B, a lower insulating film 112 and an etch stop layer 114 may be sequentially formed on the substrate 110. Thereafter, a stacked structure in which a plurality of first insulating films 122 and a plurality of second insulating films 124 are alternately stacked one by one may be formed on the etch stop layer 114. Thereafter, a protective film 126 may be formed on the stacked structure.

The plurality of first insulating films 122 and the plurality of second insulating films 124 may include materials having an etch selectivity with respect to each other. In example embodiments, the plurality of first insulating films 122 may include a silicon oxide film, and the plurality of second insulating films 124 may include a silicon nitride film. In example embodiments, the protective film 126 may include an aluminum oxide film or a titanium nitride film, without being limited thereto.

Figure 12A:
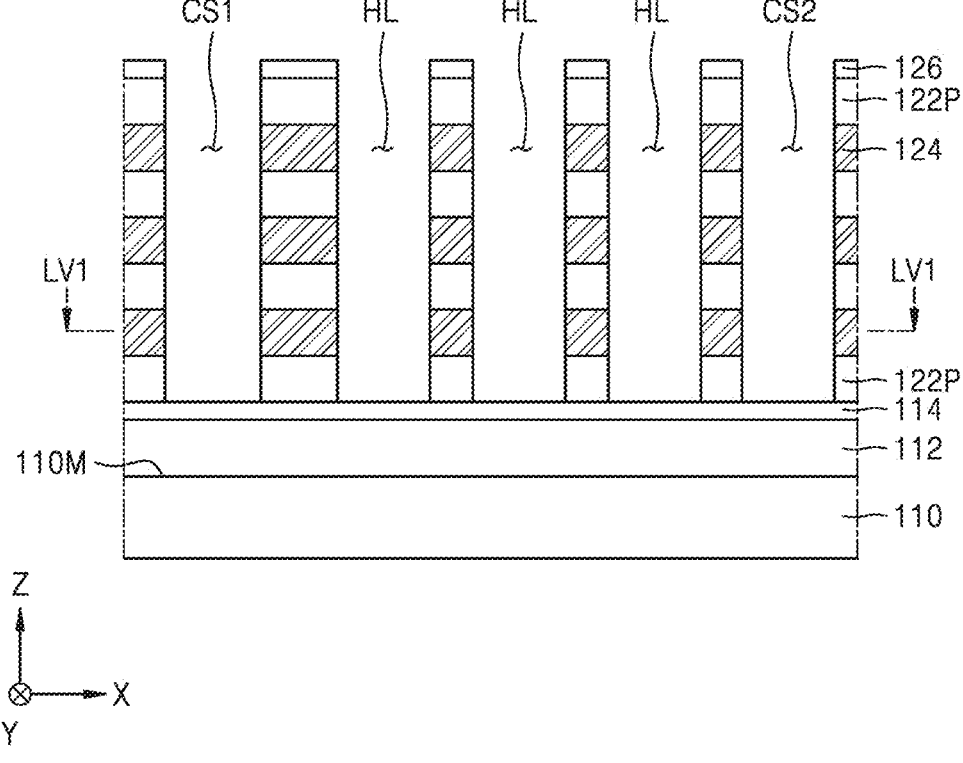
Figure 12B:
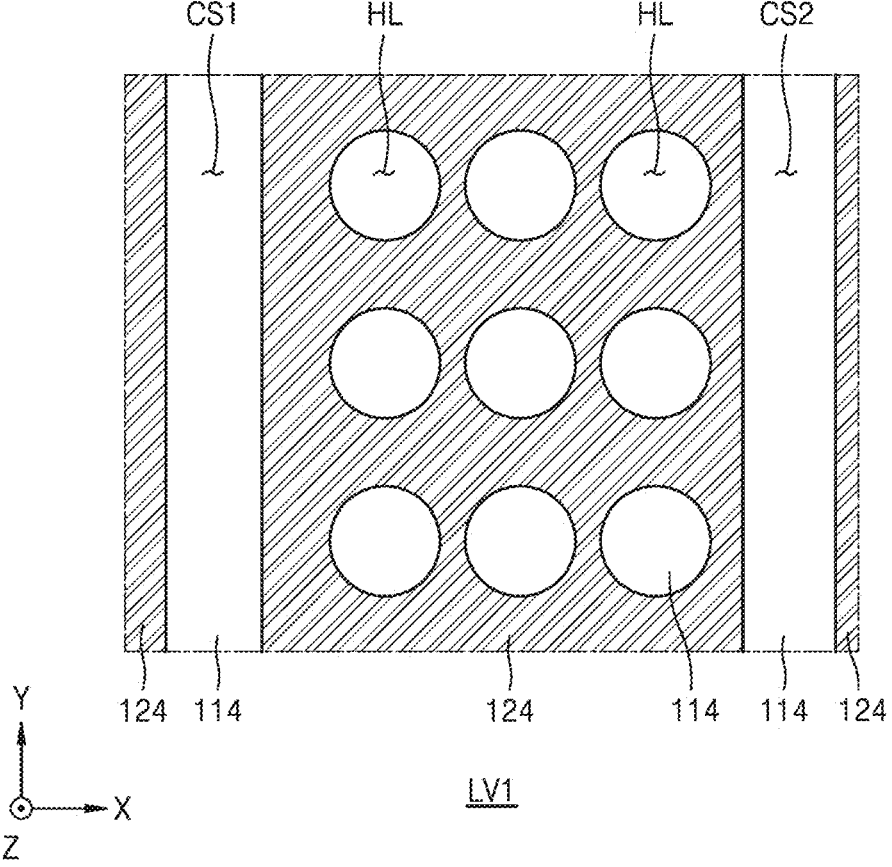

Referring to FIGS. 12A and 12B, partial regions may be etched in the resultant structure of FIGS. 11A and 11B, and thus, a plurality of via holes HL, a first cut space CS1, and a second cut space CS2 may be formed. A width of a memory cell array, which is to be formed on the substrate, in a first lateral direction (X direction) may be determined by the first cut space CS1 and the second cut space CS2.

By forming the plurality of via holes HL, the first cut space CS1, and the second cut space CS2, a plurality of inter-cell insulation patterns 122P may be formed from the plurality of first insulating films 122.

The plurality of via holes HL, the first cut space CS1, and the second cut space CS2 may be formed not to be connected to each other. The first cut space CS1 and the second cut space CS2 may be formed on the substrate 110 and extend long in a second lateral direction (Y direction). The etch stop layer 114 may be exposed at the bottom of each of the plurality of via holes HL, the first cut space CS1, and the second cut space CS2. During an etching process for forming the plurality of via holes HL, the first cut space CS1, and the second cut space CS2, the protective film 126 may protect a lower structure.

Figure 13A:
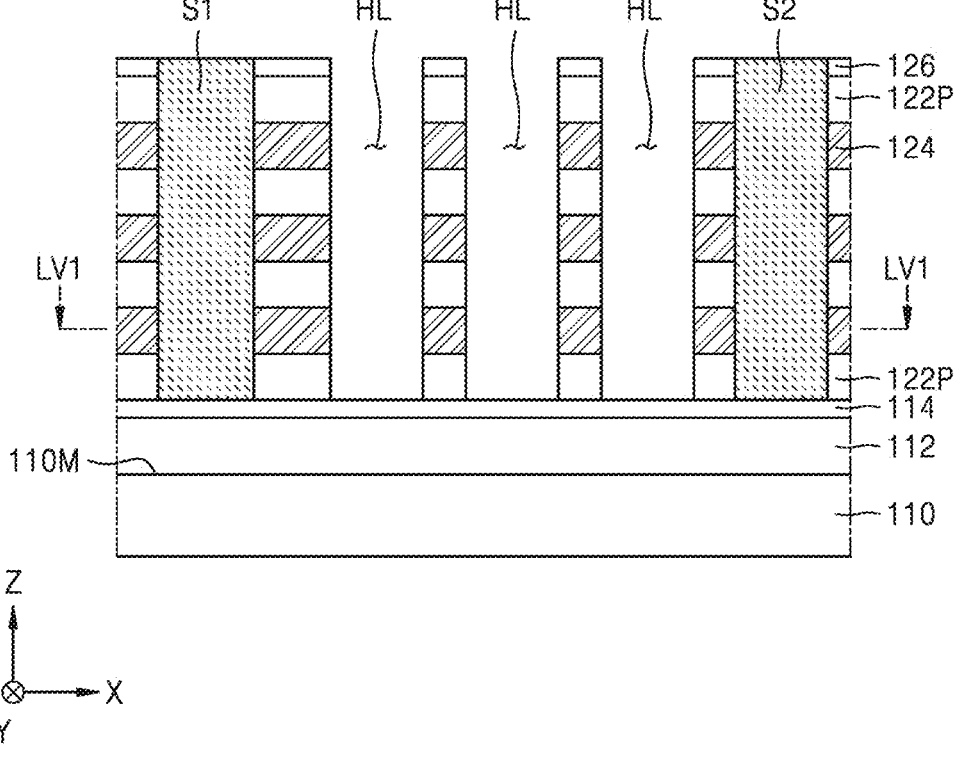
Figure 13B:
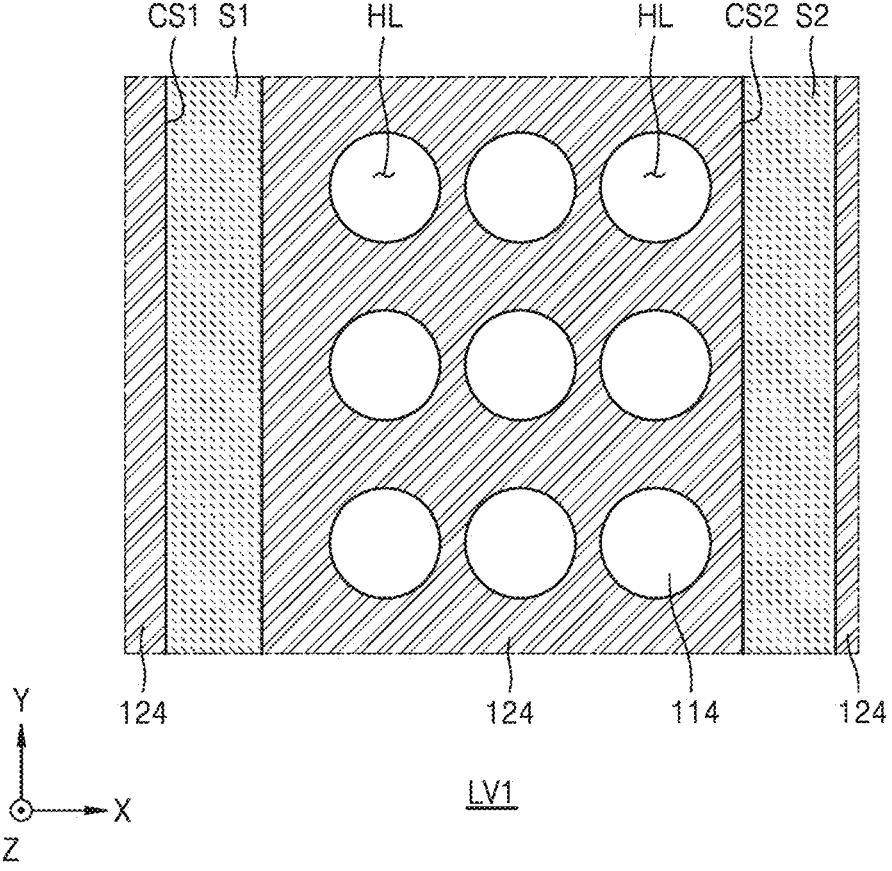

Referring to FIGS. 13A and 13B, in the resultant structure of FIGS. 12A and 12B, the first cut space CS1 and the second cut space CS2 may be respectively filled with sacrificial films S1 and S2.

In example embodiments, each of the sacrificial films S1 and S2 may include a silicon nitride film. In other example embodiments, each of the sacrificial films S1 and S2 may include a multilayered structure including a sacrificial liner and a sacrificial pattern. The sacrificial liner may include silicon oxide, and the sacrificial pattern may fill the first cut space CS1 and the second cut space CS2 on the sacrificial liner. The sacrificial pattern may include silicon nitride or polysilicon.

Figure 14A:
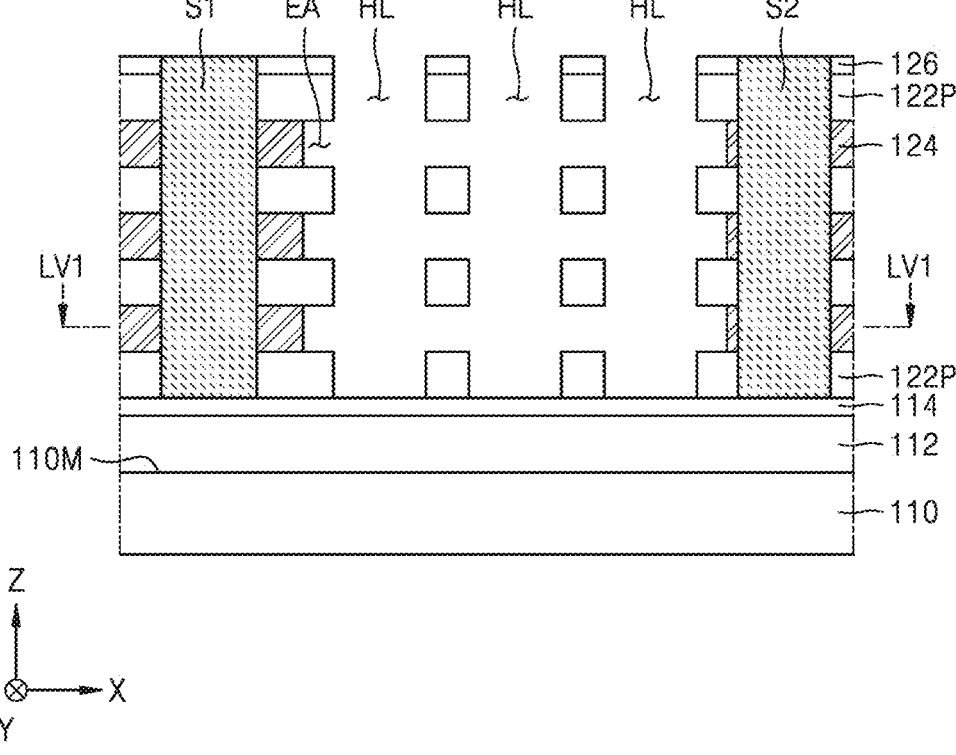
Figure 14B:
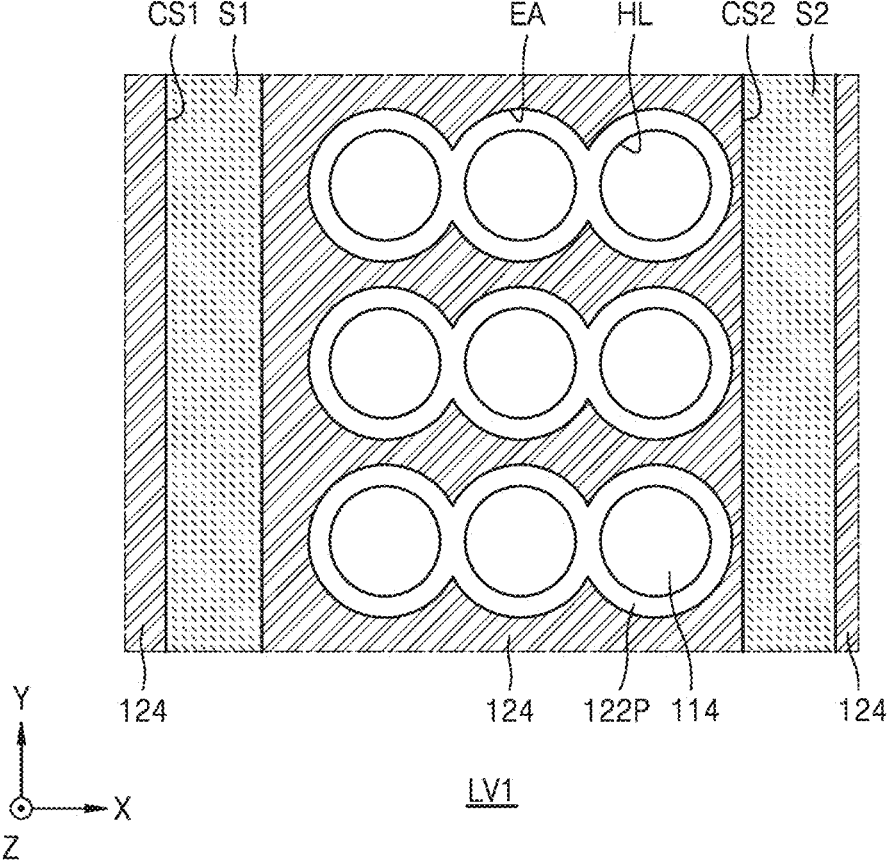

Referring to FIGS. 14A and 14B, in the resultant structure of FIGS. 13A and 13B portions of the plurality of second insulating films 124, which are respectively exposed through the plurality of via holes HL, may be selectively removed, and thus, a plurality of expansion spaces EA may be respectively formed around the plurality of via holes HL.

At a predetermined, or, alternatively, desired vertical level (e.g., the first vertical level LV1) on the substrate 110, groups of via holes HL aligned in the first lateral direction (X direction), from among the plurality of via holes HL, may be surrounded by one expansion space EA.

Figure 15A:
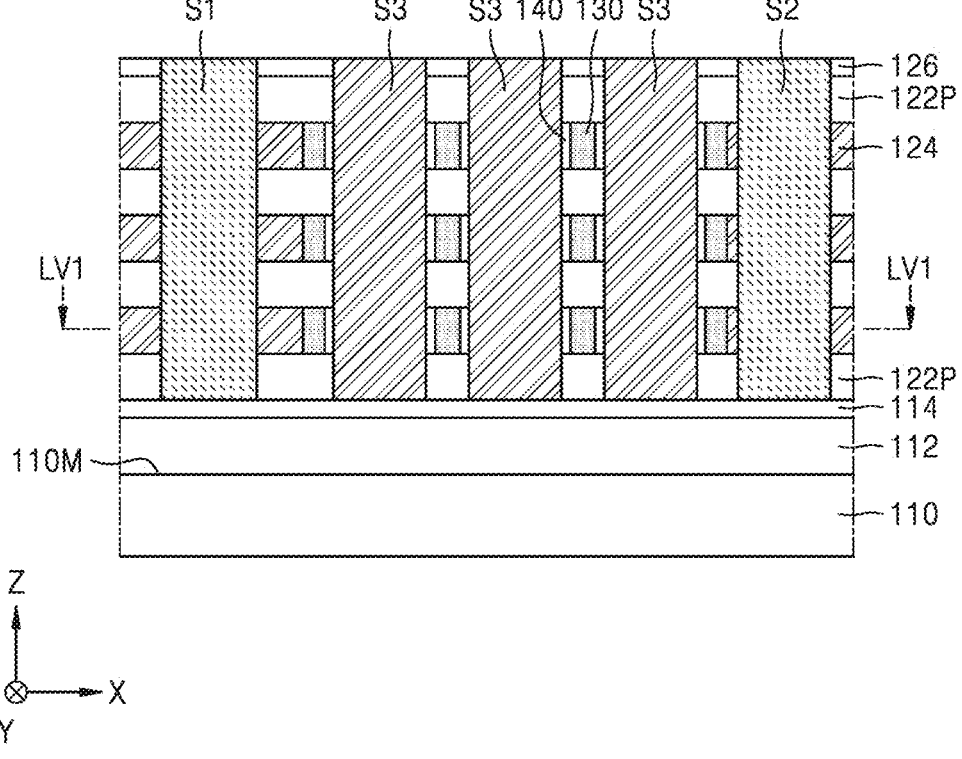
Figure 15B:
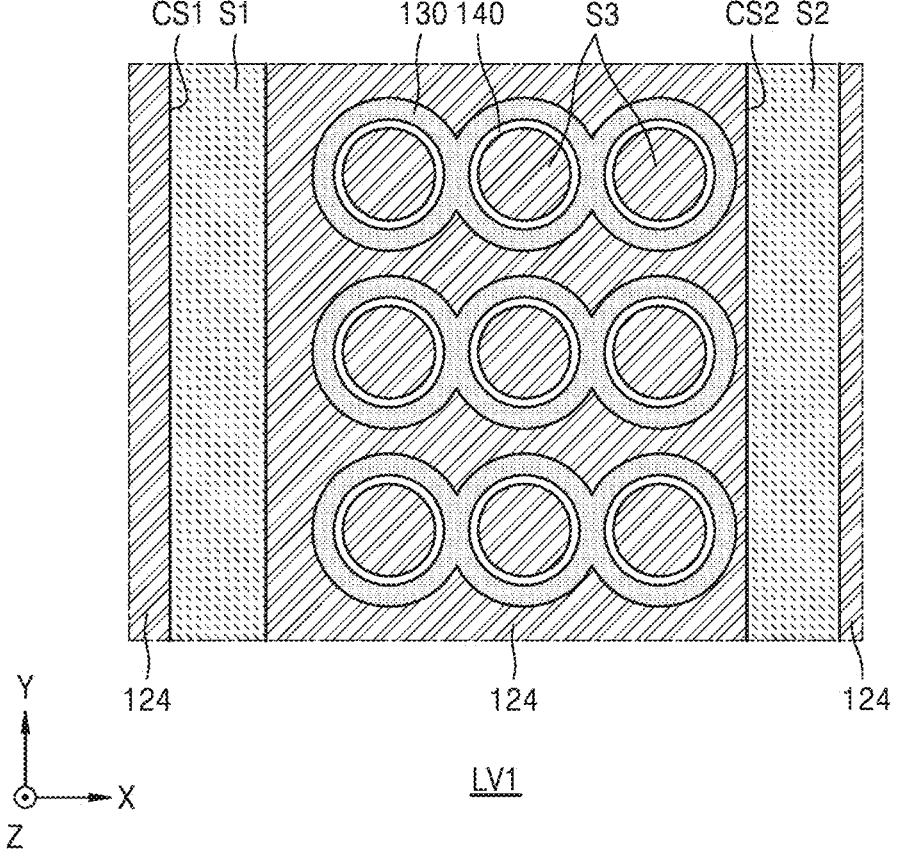

Referring to FIGS. 15A and 15B, in the resultant structure of FIGS. 14A and 14B, a plurality of horizontal channel regions 130 and a plurality of interface dielectric layers 140 may be sequentially formed in the plurality of expansion spaces EA.

In example embodiments, to form the plurality of horizontal channel regions 130 inside the plurality of expansion spaces EA, a channel liner may be formed using an atomic layer deposition (ALD) process to cover the entire surface of the resultant structure of FIGS. 14A and 14B, and unnecessary portions of the channel liner may be removed to leave the plurality of horizontal channel regions 130 inside the plurality of expansion spaces EA. In example embodiments, to form the plurality of interface dielectric layers 140 in the plurality of expansion spaces EA, a dielectric liner may be formed using an ALD process to cover the entire surface of the resultant structure including the plurality of horizontal channel regions 130, and unnecessary portions of the dielectric liner may be removed to leave the plurality of interface dielectric layers 140 inside the plurality of expansion spaces EA.

After the plurality of interface dielectric layers 140 are formed, a plurality of sacrificial plugs S3 may be formed to fill the plurality of via holes HL. In example embodiments, each of the plurality of sacrificial plugs S3 may include a silicon nitride film. In other example embodiments, each of the plurality of sacrificial plugs S3 may include a multilayered structure including a sacrificial liner and a sacrificial plug. The sacrificial liner may include silicon nitride, and the sacrificial plug may fill the corresponding one of the plurality of via holes HL on the sacrificial liner. The sacrificial plug may include polysilicon.

Figure 16A:
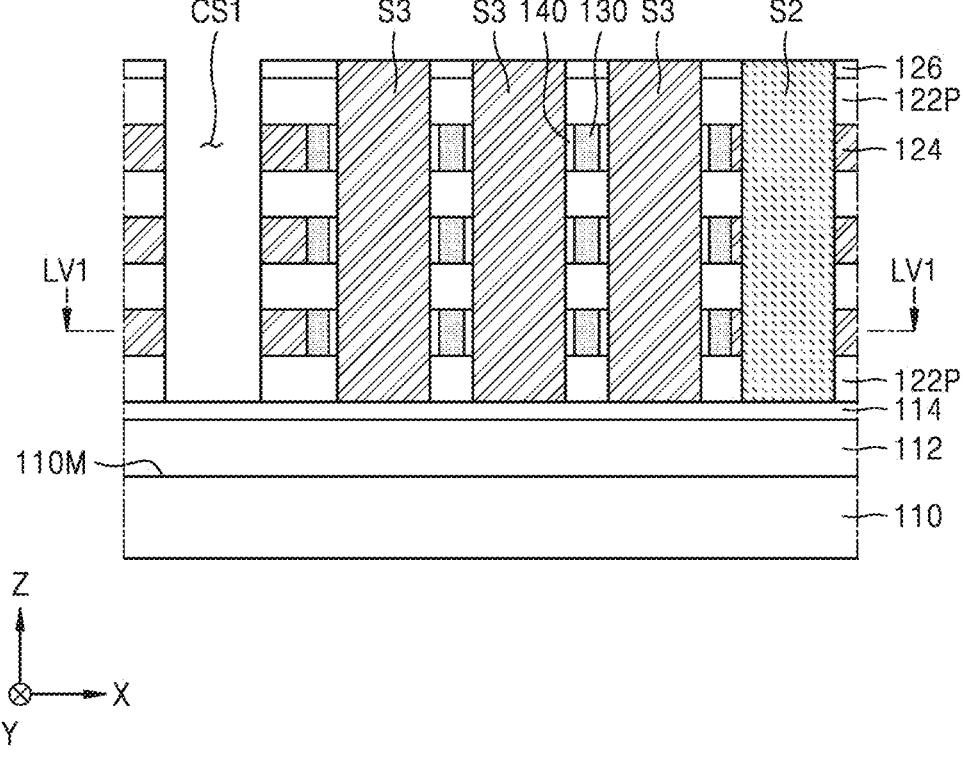
Figure 16B:
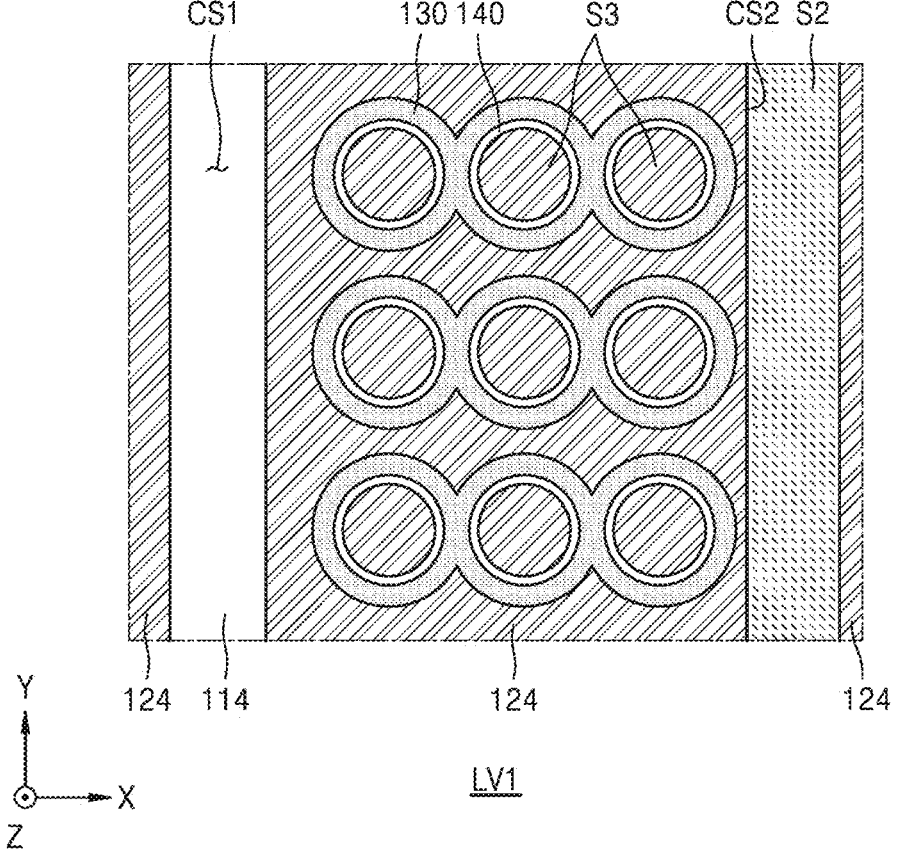

Referring to FIGS. 16A and 16B, the sacrificial film S1 may be removed from the first cut space CS1 in the resultant structure of FIGS. 15A and 15B. Thus, the etch stop layer 114 may be exposed at the bottom of the first cut space CS1, and the plurality of inter-cell insulation patterns 122P and the plurality of second insulating films 124 may be exposed at sidewalls of the first cut space CS1.

Figure 17A:
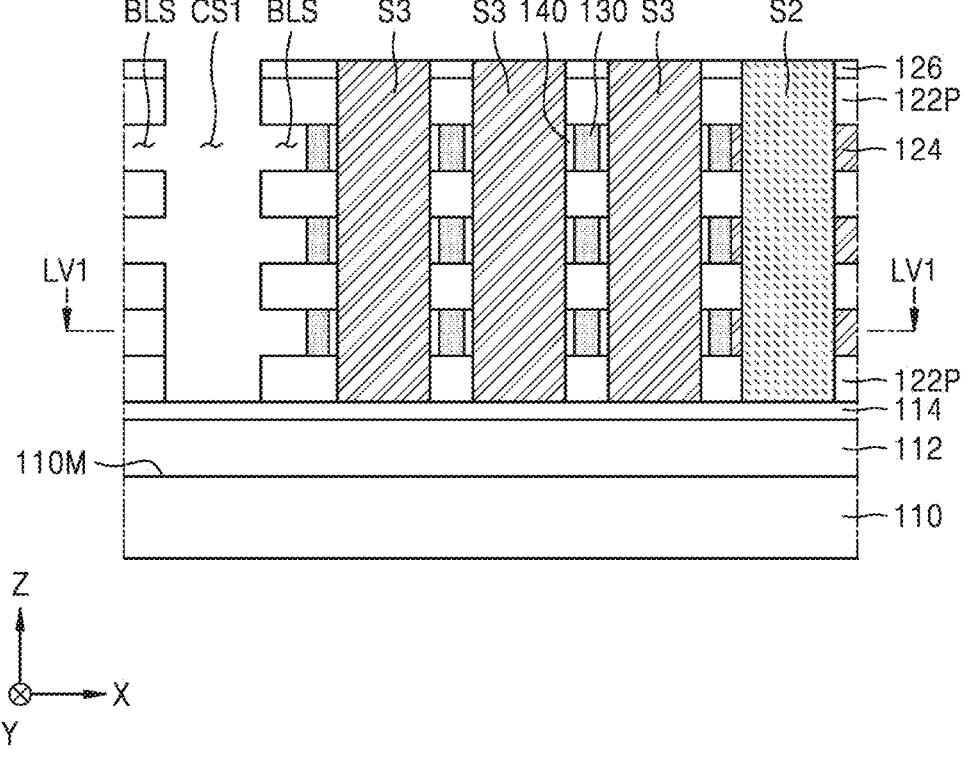
Figure 17B:
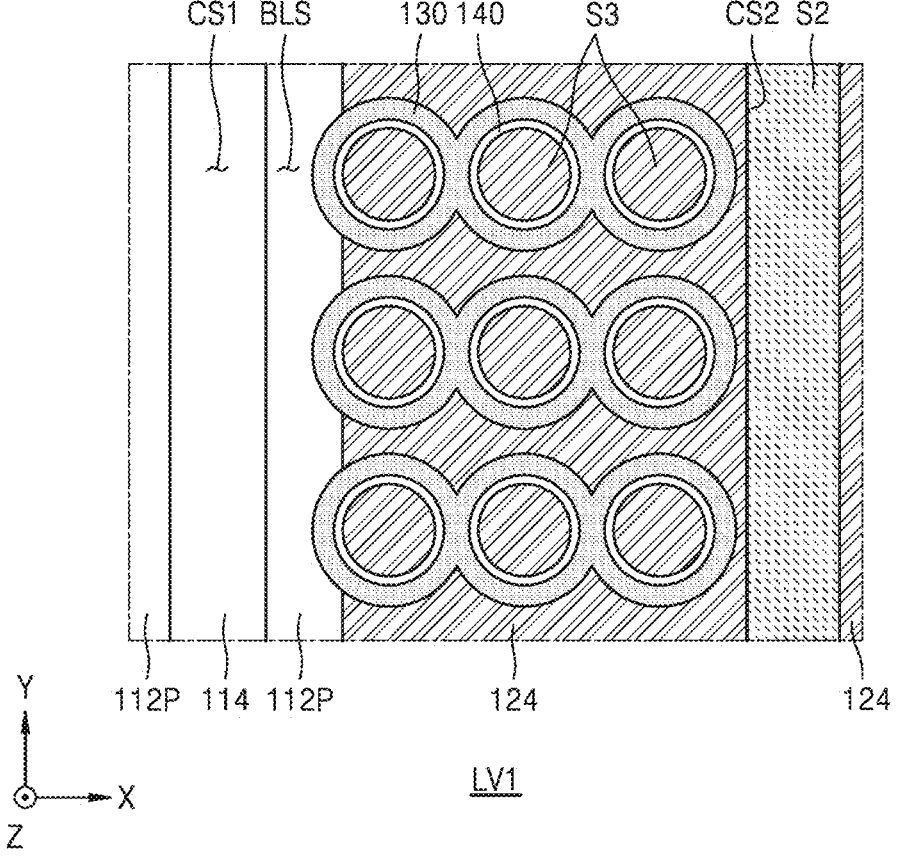

Referring to FIGS. 17A and 17B, in the resultant structure of FIGS. 16A and 16B, a portion of each of the plurality of second insulating films 124 exposed through the first space SC1 may be selectively removed, and thus, a plurality of bit line spaces BLS, which are connected to the first cut space CS1, may be formed. The plurality of horizontal channel regions 130 may be exposed through the plurality of bit line spaces BLS.

Figure 18A:
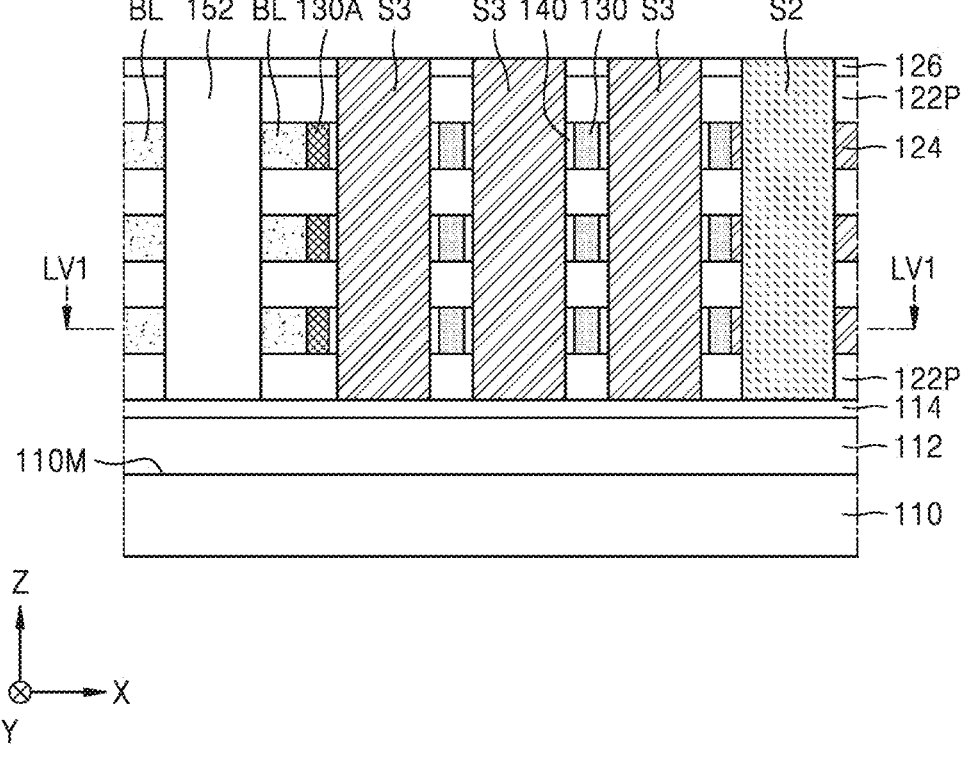
Figure 18B:
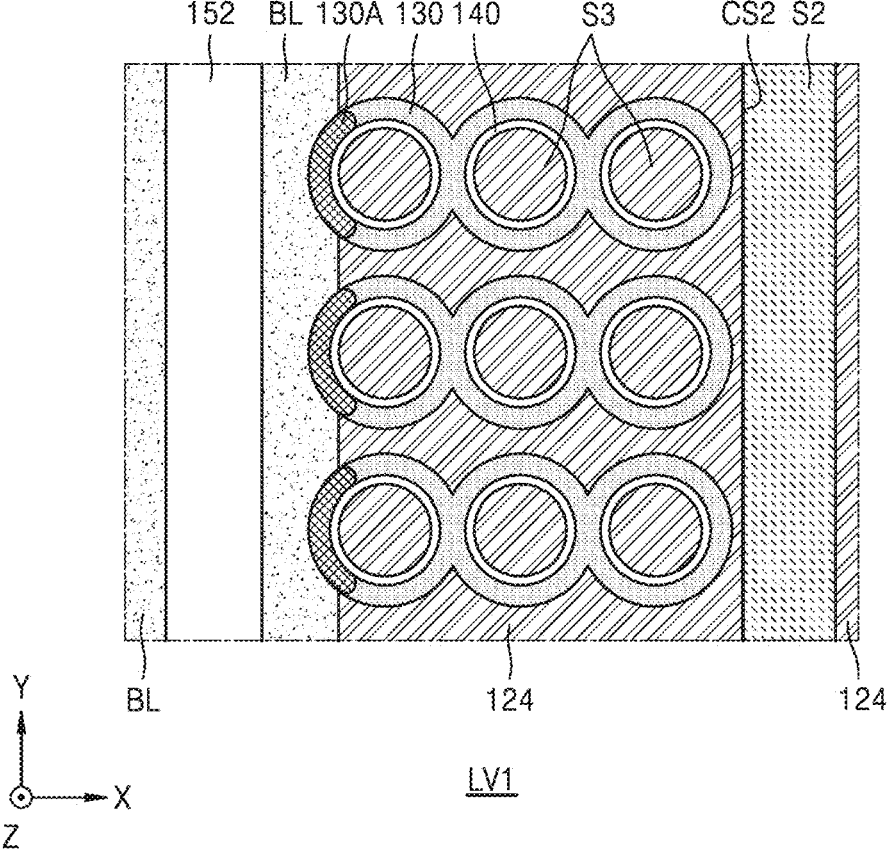

Referring to FIGS. 18A and 18B, in the resultant structure of FIGS. 17A and 17B, an ohmic contact portion 130A may be formed in a partial region of each of the plurality of horizontal channel regions 130 exposed through the plurality of bit line spaces BLS, and a plurality of bit lines BL may be formed to fill the plurality of bit line spaces BLS. Thereafter, the first cut space CS1 may be filled with an isolation insulating film 152.

In example embodiments, to form the ohmic contact portion 130A, impurity ions may be implanted into the partial region of each of the plurality of horizontal channel regions 130 through the first cut space CS1. In example embodiments, the process of forming the ohmic contact portion 130A may be omitted.

Figure 19A:
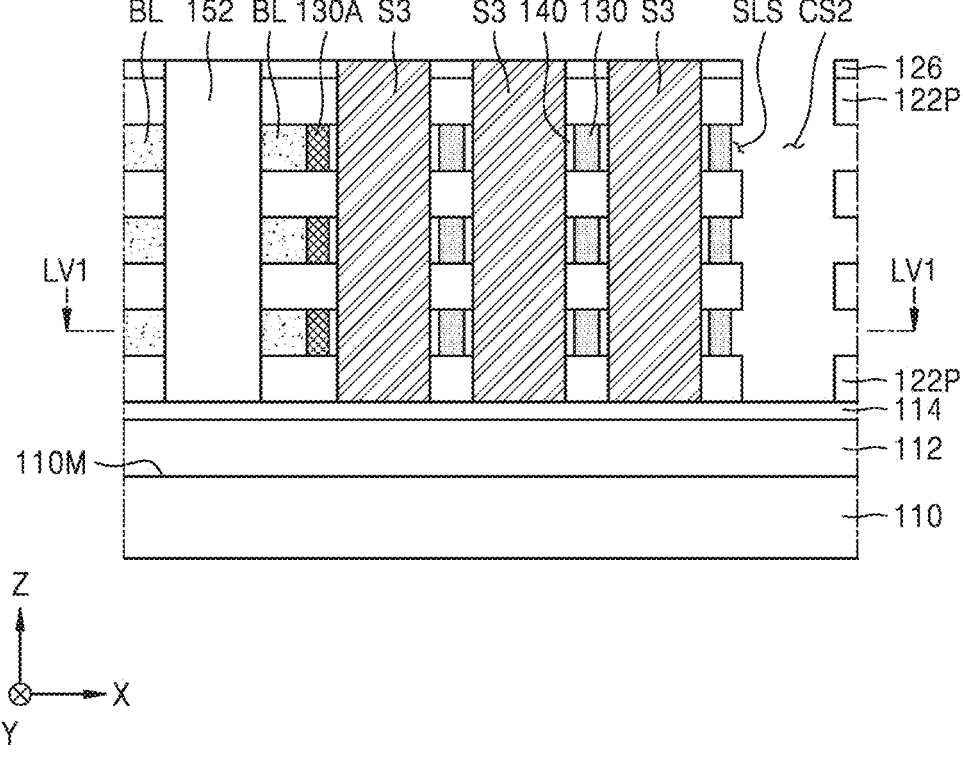
Figure 19B:
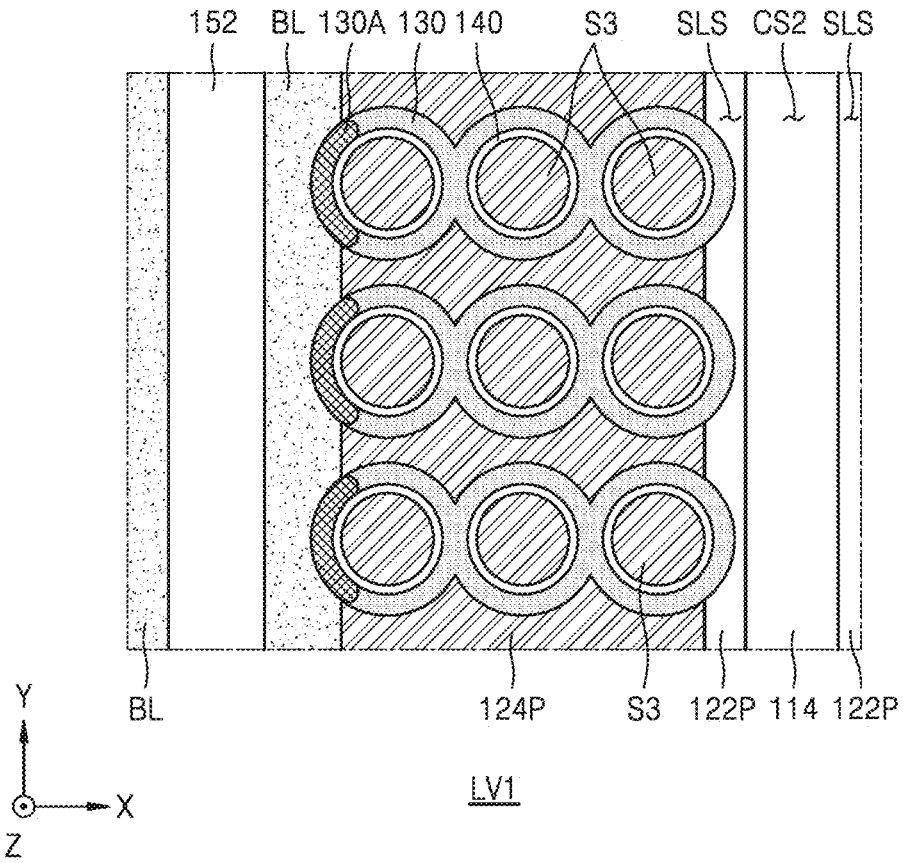

Referring to FIGS. 19A and 19B, the sacrificial film S2 may be removed from the second cut space CS2 in the resultant structure of FIGS. 18A and 18B. Thus, the etch stop layer 114 may be exposed at the bottom of the second cut space CS2, and the plurality of inter-cell insulation patterns 122P and the plurality of second insulating films 124 may be exposed at sidewalls of the second cut space CS2. Thereafter, the plurality of second insulating films 124 exposed through the second cut space CS2 may be selectively removed to form a plurality of second cut spaces SLS, which are connected to the second cut space CS2. The plurality of horizontal channel regions 130 and the inter-cell insulation pattern 122P may be exposed through the plurality of second cut spaces SLS.

To form the plurality of second cut spaces SLS, in the resultant structure from which the plurality of second insulating films 124 exposed through the second cut space CS2 are selectively removed, the remaining portions of the plurality of second insulating films 124 may constitute inter-string insulation patterns 124P.

Figure 20A:
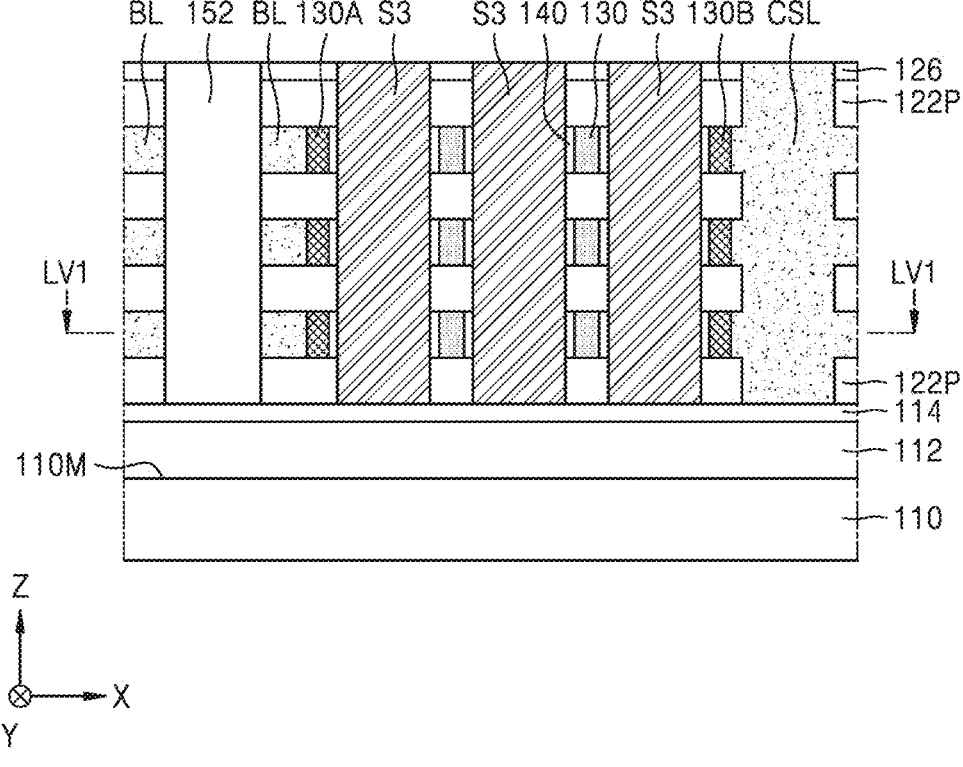
Figure 20B:
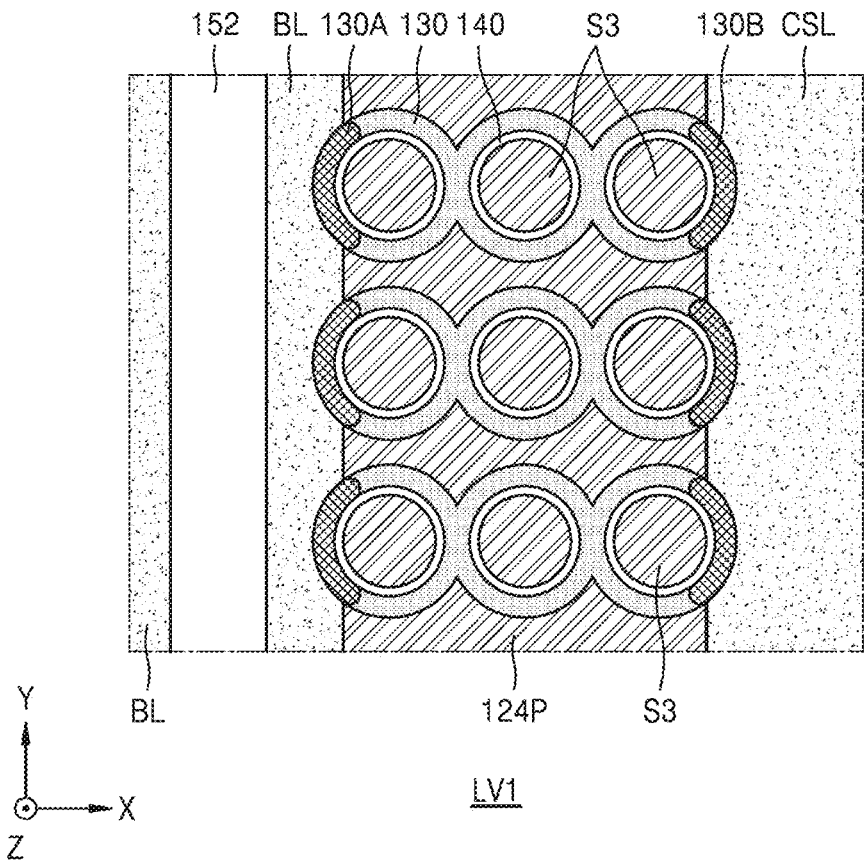

Referring to FIGS. 20A and 20B, in the resultant structure of FIGS. 19A and 19B, an ohmic contact portion 130B may be formed in a partial region of each of the plurality of horizontal channel regions 130 exposed through the plurality of second cut spaces SLS, and the plurality of second cut spaces SLS and the second cut space CS2 may be filled with the common source line CSL.

In example embodiments, to form the ohmic contact portion 130B, impurity ions may be implanted into a partial region of each of the plurality of horizontal channel regions 130 through the second cut space CS2. In example embodiments, the process of forming the ohmic contact portion 130B may be omitted.

Figure 21A:
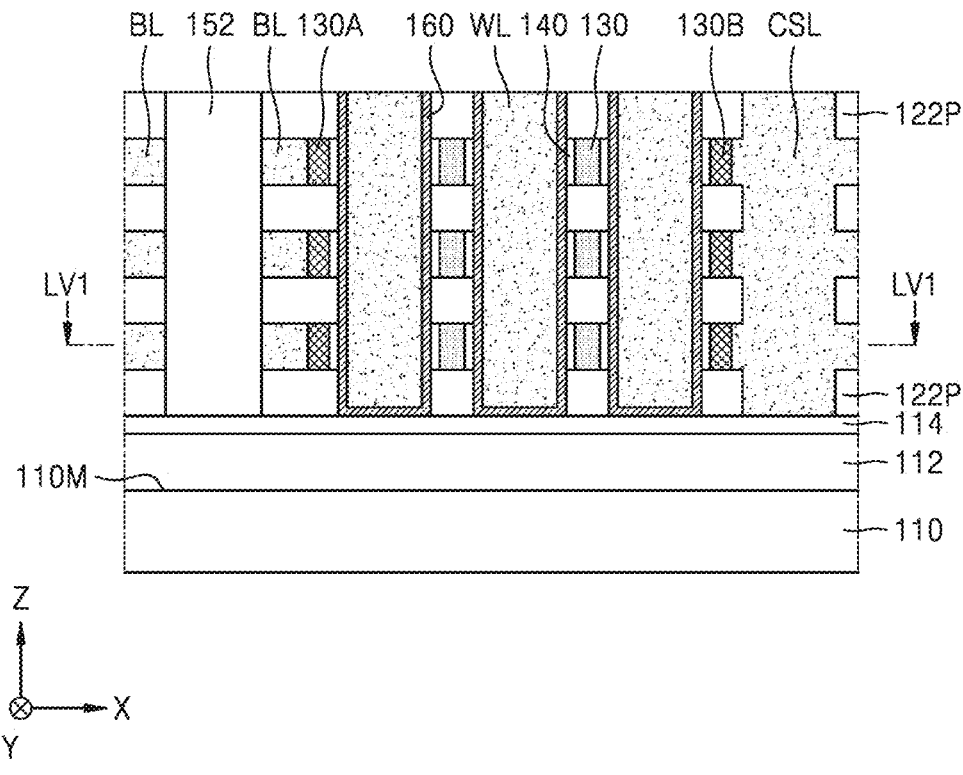
Figure 21B:
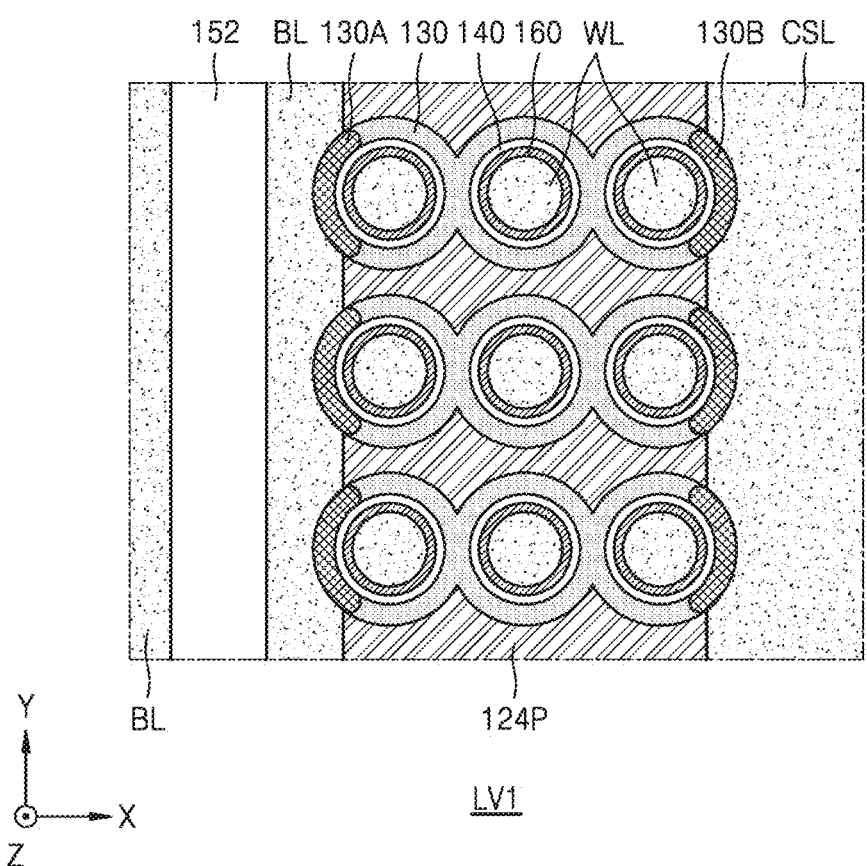

Referring to FIGS. 21A and 21B, the plurality of sacrificial plugs S3 may be removed from the plurality of via holes HL in the resultant structure of FIGS. 20A and 20B. Thereafter, a plurality of ferroelectric layers 160 may be formed to conformally cover inner walls of the plurality of via holes HL. Also, a plurality of vertical word lines WL may be formed on the plurality of ferroelectric layers 160 to fill the plurality of via holes HL.

In example embodiments, to form the plurality of ferroelectric layers 160 and the plurality of vertical word lines WL, a ferroelectric material liner may be formed to conformally cover the inner wall of each of the plurality of via holes HL on the resultant structure from which the plurality of sacrificial plugs S3 are removed. A conductive layer may be formed on the ferroelectric material liner to a sufficient thickness for filling the plurality of via holes HL. Upper portions of the conductive layer and the ferroelectric material liner may be removed using a chemical mechanical polishing (CMP) process or an etchback process to leave the plurality of ferroelectric layers 160 and the plurality of vertical word lines WL.

In other example embodiments, instead of forming the plurality of ferroelectric layers 160, a ferroelectric material liner may be formed to conformally cover an inner wall of each of the plurality of via holes HL on the resultant structure from which the plurality of sacrificial plugs S3 are removed. Thereafter, the ferroelectric material liner may be etched back, and thus, a plurality of ferroelectric layers may be formed. The plurality of ferroelectric layers may have a shape that covers a sidewall of each of the plurality of via holes HL but does not cover a bottom of each of the plurality of via holes HL. Thereafter, a plurality of vertical word lines WL may be formed to fill the plurality of via holes HL. In this case, a lower surface of each of the plurality of vertical word lines WL may not be covered by a ferroelectric layer.

During the formation of the plurality of ferroelectric layers 160 and the plurality of vertical word lines WL, the protective film 126 may be removed to expose an upper surface of an uppermost one of the plurality of inter-cell insulation patterns 122P.

In the method of manufacturing the 3D non-volatile memory device 100, which has been described with reference to FIGS. 11A to 21B, after the plurality of horizontal channel regions 130 and the plurality of bit lines BL, which overlap each other in the vertical direction (Z direction), and the common source line CSL are first formed, the plurality of ferroelectric layers 160 and the plurality of vertical word lines WL, which pass through the plurality of horizontal channel regions 130 in the vertical direction (Z direction), may be formed. Accordingly, in the process of manufacturing the 3D non-volatile memory device 100, a thermal budget of the ferroelectric layer 160 including a material that is relatively vulnerable to the thermal budget may be reduced. Therefore, the possibility of deterioration of the ferroelectric layer 160 during the manufacturing process of the 3D non-volatile memory device 100 and/or the possibility of occurrence of defects (e.g., oxygen vacancy due to undesired intermixing of the ferroelectric layer 160 with a metal-containing film adjacent thereto) may be markedly reduced, and the reliability of the 3D non-volatile memory device 100 may be improved.

Although the method of manufacturing the 3D non-volatile memory device 100 has been described with reference to FIGS. 11A to 21B, it will be understood that the 3D non-volatile memory devices 200, 300, 400, 500, 600, 700, 700A, 700B, 800, and 900 shown in FIGS. 2 to 10 may be manufactured by making various modifications and changes within the scope of the inventive concepts.

For example, to manufacture the 3D non-volatile memory device 200 shown in FIG. 3, a separation distance between the second cut space CS2 and the plurality of via holes HL in the first lateral direction (X direction) may be increased more than in FIGS. 12A and 12B in the process described with reference to FIGS. 12A and 12B. Thereafter, the ohmic contact portion 130B may be formed in a partial region of each of the plurality of horizontal channel regions 130 in the process described with reference to FIGS. 20A and 20B. Afterwards, the plurality of source lines SL may be formed through the second cut space CS2 to fill the plurality of second cut spaces (refer to SLS in FIGS. 19A and 19B). Afterwards, the second cut space CS2 may be filled with an insulating film.

In example embodiments, to manufacture the 3D non-volatile memory device 300 shown in FIG. 4, a process of removing at least portions of the plurality of second insulating films 124 through the plurality of bit line spaces BLS before the plurality of bit lines BL are formed in the process described with reference to FIGS. 18A and 18B and/or a process of removing at least portions of the plurality of second insulating films 124 through the second cut space CS2 before the common source line CSL is formed in the process described with reference to FIGS. 20A and 20B may be performed. Thus, a plurality of air gaps AG may be formed. In this case, in the process of forming the plurality of bit lines BL and/or the process of forming the common source line CSL, a first deposition process of depositing a conductive material by using a deposition process that provides a relatively poor step coverage may be first performed to close the plurality of air gap AG, and then a second deposition process that provides a relatively good step coverage may be performed.

In example embodiments, to manufacture the 3D non-volatile memory devices 400 and 500 shown in FIGS. 5 and 6, in the process described with reference to FIGS. 12A and 12B, a distance between the first cut space CS1 and the second cut space CS2 in the first lateral direction (X direction) and the number and arrangement of via holes HL may be variously designed as needed.

While the inventive concepts have been particularly shown and described with reference to embodiments thereof, it will be understood that various changes in form and details may be made therein without departing from the spirit and scope of the following claims.

What is claimed is:

1. A three-dimensional non-volatile memory device comprising:
   a memory cell array comprising
      a plurality of memory cells repeatedly arranged in a first lateral direction, a second lateral direction, and a vertical direction on a substrate, the first lateral direction and the second lateral direction being parallel to a main surface of the substrate and perpendicular to each other, and the vertical direction being perpendicular to the main surface of the substrate,
      a plurality of horizontal channel regions extending in the first lateral direction on the substrate, the plurality of horizontal channel regions overlapping each other and apart from each other in the vertical direction,
      a vertical word line passing through the plurality of horizontal channel regions in the vertical direction, and
      a ferroelectric layer between the vertical word line and the plurality of horizontal channel regions, the ferroelectric layer passing through the plurality of horizontal channel regions in the vertical direction.

2. The three-dimensional non-volatile memory device of claim 1, wherein
   the memory cell array further comprises a plurality of inter-cell insulation patterns respectively one by one between the plurality of horizontal channel regions, the plurality of inter-cell insulation patterns overlapping the plurality of horizontal channel regions in the vertical direction, and
   the vertical word line comprises
      a plurality of first local regions surrounded by the plurality of horizontal channel regions, and
      a plurality of second local regions surrounded by the plurality of inter-cell insulation patterns.

3. The three-dimensional non-volatile memory device of claim 1, wherein the memory cell array further comprises:
   a plurality of interface dielectric layers between the ferroelectric layer and the plurality of horizontal channel regions, the plurality of interface dielectric layers being at the same vertical level as the plurality of horizontal channel regions, wherein
   the ferroelectric layer surrounds an outer surface of the vertical word line and is in contact with the outer surface of the vertical word line.

4. The three-dimensional non-volatile memory device of claim 1, wherein the memory cell array further comprises:
   a plurality of interface dielectric layers between the vertical word line and the plurality of horizontal channel regions, the plurality of interface dielectric layers being at the same vertical level as the plurality of horizontal channel regions; and
   a plurality of metal-containing patterns between the vertical word line and the plurality of interface dielectric layers, the plurality of metal-containing patterns being at the same vertical level as the plurality of horizontal channel regions,
   wherein the ferroelectric layer is between the vertical word line and the plurality of metal containing patterns, wherein
   an inner surface of the ferroelectric layer is in contact with the vertical word line, and a local surface of an outer surface of the ferroelectric layer, which faces the plurality of horizontal channel regions, is in contact with the metal-containing pattern.

5. The three-dimensional non-volatile memory device of claim 1, wherein the memory cell array further comprises:
   a plurality of inter-cell insulation patterns respectively one by one between the plurality of horizontal channel regions, the plurality of inter-cell insulation patterns overlapping the plurality of horizontal channel regions in the vertical direction; and
   a gate dielectric film structure between the vertical word line and the plurality of horizontal channel regions, the gate dielectric film structure comprising a tunneling dielectric film, a charge storage film, and a blocking dielectric film, which are sequentially arranged in a direction toward the vertical word line from an inner surface of each of the plurality of horizontal channel regions, and wherein
   at least one of the tunneling dielectric film, the charge storage film, and the blocking dielectric film passes through the plurality of horizontal channel regions and the plurality of inter-cell insulation patterns in the vertical direction.

6. The three-dimensional non-volatile memory device of claim 1, wherein the memory cell array further comprises:
   a plurality of inter-cell insulation patterns respectively one by one between the plurality of horizontal channel regions, the plurality of inter-cell insulation patterns overlapping the plurality of horizontal channel regions in the vertical direction; and
   a plurality of gate dielectric film structures between the vertical word line and the plurality of horizontal channel regions, each of the plurality of gate dielectric film structures comprises:
      a tunneling dielectric film,
      a charge storage film, and
      a blocking dielectric film, which are sequentially arranged in a direction toward
      the vertical word line from an inner surface of each of the plurality of horizontal
      channel regions, and wherein
   at least one of the tunneling dielectric film, the charge storage film, and the blocking dielectric film has a maximum vertical length, which is defined by two inter-cell insulation patterns, which are adjacent to each other in the vertical direction, from among the plurality of inter-cell insulation patterns.

7. The three-dimensional non-volatile memory device of claim 1, wherein the memory cell array further comprises a plurality of conductive lines extending in the second lateral direction on the substrate, the plurality of conductive lines overlapping each other and apart from each other in the vertical direction, and wherein each of the plurality of conductive lines is in contact with a selected one of the plurality of horizontal channel regions.

8. A three-dimensional non-volatile memory device comprising:

a substrate having a main surface;

a plurality of horizontal channel regions overlapping each other and apart from each other in a vertical direction on the substrate, each horizontal channel region extending parallel to the main surface of the substrate;

a plurality of inter-cell insulation patterns respectively one by one between the plurality of horizontal channel regions;

a plurality of vertical word lines passing through the plurality of horizontal channel regions and the plurality of inter-cell insulation patterns in the vertical direction, each of the plurality of horizontal channel regions comprising a plurality of ring channel portions regularly arranged in a first lateral direction and a plurality of connection portions respectively between the plurality of ring channel portions, the plurality of ring channel portions defining a plurality of first local holes located apart from each other, the plurality of inter-cell insulation patterns comprising a plurality of second local holes, which are aligned with the plurality of first local holes in the vertical direction, and the plurality of vertical word lines passing through the plurality of horizontal channel regions and the plurality of inter-cell insulation patterns in the vertical direction via the plurality of first local holes and the plurality of second local holes; and a plurality of ferroelectric layers passing through the plurality of horizontal channel regions and the plurality of inter-cell insulation patterns in the vertical direction via the plurality of first local holes and the plurality of second local holes.

9. The three-dimensional non-volatile memory device of claim 8, wherein the plurality of vertical word lines are arranged in a straight line in the first lateral direction.

10. The three-dimensional non-volatile memory device of claim 8, wherein the plurality of vertical word lines are arranged in zigzag in the first lateral direction.

11. The three-dimensional non-volatile memory device of claim 8, further comprising:

a plurality of interface dielectric layers surrounding outer sidewalls of the plurality of ferroelectric layers inside the plurality of first local holes, wherein each of the plurality of ferroelectric layers is in contact with an outer sidewall of a selected one of the plurality of vertical word lines.

12. The three-dimensional non-volatile memory device of claim 8, further comprising:

a plurality of metal-containing patterns surrounding outer sidewalls of the plurality of ferroelectric layers inside the plurality of first local holes, wherein each of the plurality of metal-containing patterns has a maximum vertical length, which is defined by two inter-cell insulation patterns, which are adjacent to each other in the vertical direction, from among the plurality of inter-cell insulation patterns.

13. The three-dimensional non-volatile memory device of claim 8, further comprising:

a plurality of gate dielectric film structures surrounding outer surfaces of the plurality of vertical word lines inside the plurality of first local holes, and wherein each of the plurality of gate dielectric film structures comprises a tunneling dielectric film, a charge storage film, and a blocking dielectric film, which are sequentially arranged in a direction toward one of the plurality of vertical word lines from an inner surface of a corresponding ring channel portion of each of the plurality of horizontal channel regions, and at least one of the tunneling dielectric film, the charge storage film, and the blocking dielectric film passes through the plurality of horizontal channel regions and the plurality of inter-cell insulation patterns in the vertical direction via the plurality of first local holes and the plurality of second local holes.

14. The three-dimensional non-volatile memory device of claim 8, further comprising:

a plurality of gate dielectric film structures surrounding outer surfaces of the plurality of vertical word lines inside the plurality of first local holes, and wherein each of the plurality of gate dielectric film structures comprises a tunneling dielectric film, a charge storage film, and a blocking dielectric film, which are sequentially arranged in a direction toward one of the plurality of vertical word lines from an inner surface of the ring channel portion of each of the plurality of horizontal channel regions, and at least one of the tunneling dielectric film, the charge storage film, and the blocking dielectric film has a maximum vertical length, which is defined by two adjacent ones of the plurality of inter-cell insulation patterns.

15. A three-dimensional non-volatile memory device comprising:

a substrate having a main surface;

a memory cell array comprising a plurality of memory cell strings, each memory cell string extending in a first lateral direction that is parallel to the main surface of the substrate, the plurality of memory cell strings being repeatedly arranged in a second lateral direction and a vertical direction, wherein the second lateral direction is parallel to the main surface of the substrate and perpendicular to the first lateral direction, and the vertical direction is perpendicular to the main surface of the substrate;

a plurality of bit lines, each bit line being connected to one side of a corresponding one of the plurality of memory cell strings, the plurality of bit lines overlapping each other and apart from each other in the vertical direction; and at least one source line apart from the plurality of bit lines with the plurality of memory cell strings therebetween in the first lateral direction, the at least one source line being connected to another side of each of the plurality of memory cell strings, each of the plurality of memory cell strings comprising:

a horizontal channel region comprising a plurality of ring channel portions regularly arranged in the first lateral direction and a plurality of connection portions respectively between the plurality of ring channel portions, the plurality of ring channel portions defining a plurality of local holes located apart from each other;

a plurality of vertical word lines passing through the horizontal channel region in the vertical direction via the plurality of local holes; and a plurality of ferroelectric layers passing through the horizontal channel region in the vertical direction via the plurality of local holes.

16. The three-dimensional non-volatile memory device of claim 15, wherein each of the plurality of bit lines is shared among a first group of memory cell strings, which are at the same vertical level on the main surface of the substrate, and each of the plurality of ferroelectric layers is in contact with an outer sidewall of a selected one of the plurality of vertical word lines.

17. The three-dimensional non-volatile memory device of claim 15, wherein each of the plurality of vertical word lines is shared among a second group of memory cell strings, which overlap each other in the vertical direction, from among the plurality of memory cell strings.

18. The three-dimensional non-volatile memory device of claim 15, wherein the at least one source line comprises a common source line connected to another side of each of the plurality of memory cell strings.

19. The three-dimensional non-volatile memory device of claim 15, wherein the at least one source line comprises a plurality of source lines, each source line being connected to one side of a corresponding one of the plurality of memory cell strings, the plurality of source lines overlapping each other and apart from each other in the vertical direction, and each of the plurality of source lines is shared among a first group of memory cell strings at the same vertical level on the main surface of the substrate.

20. The three-dimensional non-volatile memory device of claim 15, further comprising:

a peripheral circuit structure between the substrate and the memory cell array, the peripheral circuit structure comprising a plurality of transistors and a plurality of wiring structures connected to the plurality of transistors, and wherein the plurality of wiring structures comprise at least one conductive line connected to at least one of the plurality of vertical word lines.

* * * * *